United States Patent [19]

Shattil

[11] Patent Number: 5,523,526
[45] Date of Patent: Jun. 4, 1996

[54] SUSTAINING DEVICES FOR STRINGED MUSICAL INSTRUMENTS

[75] Inventor: Steve Shattil, Boulder, Colo.

[73] Assignee: Genesis Magnetics Corporation, Boulder, Colo.

[21] Appl. No.: 97,272

[22] Filed: Jul. 23, 1993

[51] Int. Cl.$^6$ .................................................. G10H 3/14
[52] U.S. Cl. ........................................................ 84/728
[58] Field of Search .............................. 84/723, 726, 728, 84/743

[56] References Cited

U.S. PATENT DOCUMENTS

| | | |
|---|---|---|
| 3,742,113 | 6/1973 | Cohen . |
| 3,813,473 | 5/1974 | Terymenko . |
| 4,075,921 | 2/1978 | Heet . |
| 4,137,811 | 2/1979 | Kakehashi . |
| 4,181,058 | 1/1980 | Suenagu . |
| 4,236,433 | 12/1980 | Holland . |
| 4,245,540 | 1/1981 | Groupp . |
| 4,484,508 | 11/1984 | Nourney . |
| 4,581,974 | 4/1986 | Fender . |
| 4,581,975 | 4/1986 | Fender . |
| 4,697,491 | 10/1987 | Maloney . |
| 4,907,483 | 3/1990 | Rose . |
| 4,941,388 | 7/1990 | Hoover . |
| 5,070,759 | 12/1991 | Hoover . |
| 5,123,324 | 6/1992 | Rose . |
| 5,189,241 | 2/1993 | Nakamura ................. 84/728 |
| 5,200,569 | 4/1993 | Moore . |
| 5,206,449 | 4/1993 | McClish ................... 84/723 |
| 5,233,123 | 8/1993 | Rose et al. ............... 84/726 |
| 5,292,999 | 3/1994 | Tumura ................... 84/728 |

FOREIGN PATENT DOCUMENTS 0527654  8/1992  European Pat. Off. ......... G10H 3/26

Primary Examiner—William M. Shoop, Jr.
Assistant Examiner—Jeffrey W. Donels
Attorney, Agent, or Firm—Charles E. Rohrer

[57] ABSTRACT

A sustaining device for prolonging the vibration of a string of a stringed musical instrument having a magnetic pickup means responsive to vibration of a string, and an electromagnetic string driver means to provide a magnetic drive force to the string. A cancellation circuit is provided for reducing electromagnetic feedback between the pickup and driver by adjusting the relative phase and amplitude between a first and second pickup signal and combining the signals so that the responses to electromagnetic interference cancel. One embodiment of the cancellation circuit includes a second electromagnetic driver that generates an amplitude-adjusted and phase-adjusted electromagnetic field to cancel electromagnetic interference. The driver may be a section of toroidal solenoid that is shaped so that its endpoles are in close proximity to the string for concentrating magnetic flux along the string. The strings are provided with electrical current which interacts with magnetic flux generated by the driver for driving the string in a second orthogonal plane of vibration. Electromagnetic interference between separate sustain devices is reduced by placing the components of each pickup means equidistant to each of the drivers. Automatic level control means is provided to each of a plurality of sustain devices to minimize the effects of magnetic damping on the strings. A hand-held sustaining device is provided with an encapsulating means for separating the driver from other elements of the device.

41 Claims, 18 Drawing Sheets

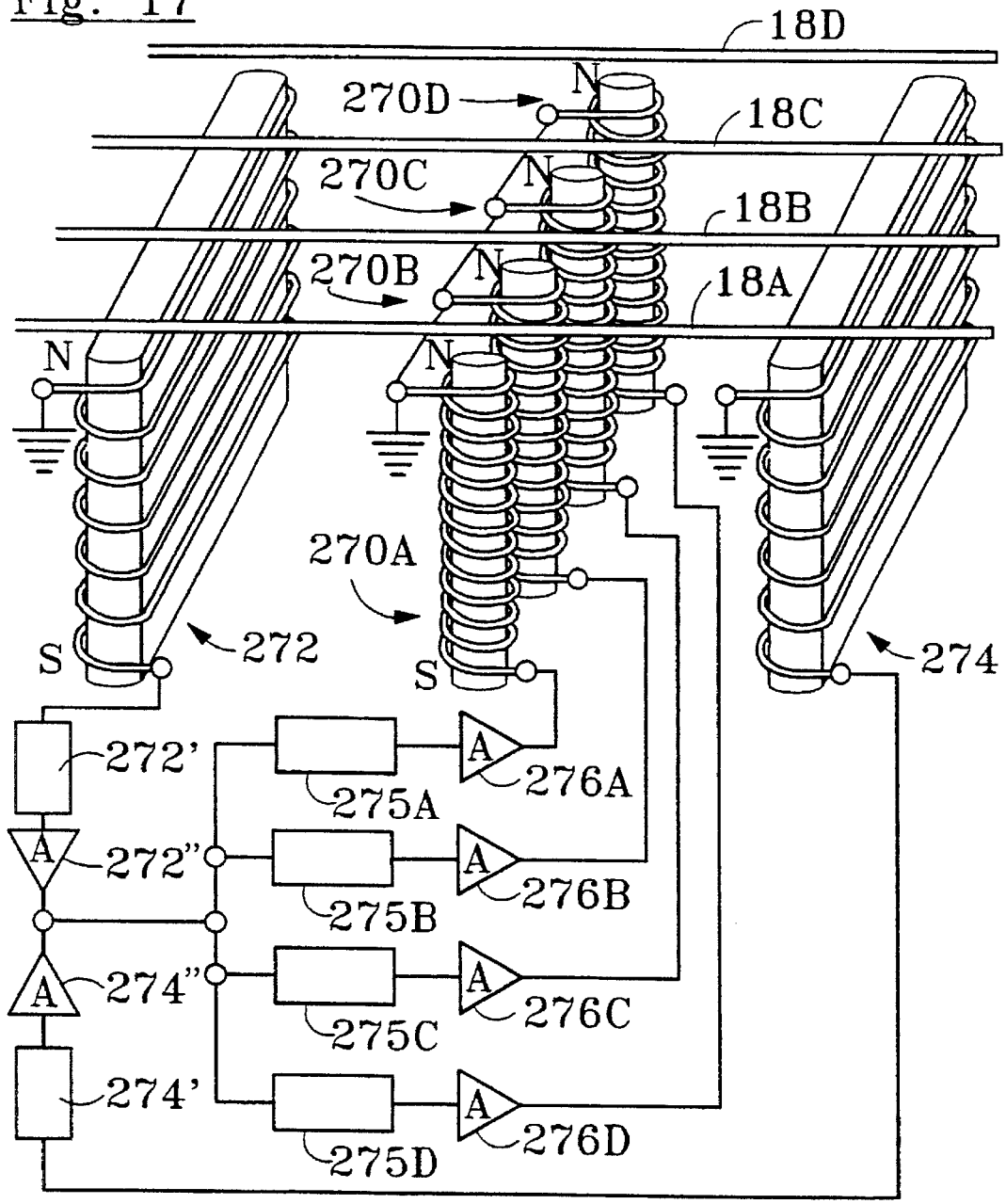

SUSTAINING DEVICES FOR STRINGED MUSICAL INSTRUMENTS

BACKGROUND OF THE INVENTION

Musical instruments employing a vibrating mechanical element such as a string to produce sound have been provided heretofore with transducers commonly referred to as "pick-ups" for detecting the motion of the vibrating element and producing an electronic signal representing this vibration. This pickup signal may be amplified and converted to sound by a loudspeaker.

The sound produced by instruments of this nature dies out progressively after the string is excited. The sound can be prolonged if the pickup signal is amplified and coupled to the vibrating mechanical element of the instrument by acoustical, electromechanical, or electromagnetic feedback.

Acoustical feedback occurs when the energy in the sound output of the speakers strikes the vibratory element of the musical instrument, driving its vibrations. If the sound output is high enough the oscillations of the vibrating mechanical element will be sustained, However, this approach is effective only when the sound produced by the amplification of the loud speaker is extraordinarily loud.

Various attempts have been made to provide a "sustainer" or device capable of prolonging the notes independently of acoustical feedback from the environment in which an instrument is played. A typical, prior art sustaining device 11 is shown in FIG. 1A as including a magnetic pickup 10, a magnetic driver 12, and an amplifier 14 interposed in a circuit between the pickup 10 and the driver 12. The pickup 10 is typically comprised of one or more pickup coils, such as pickup coil 13. The driver 12 is typically comprised of one or more driver coils, such as driver coil 15.

The sustain system 11 may be used to sustain the vibrations of a single string, such as string 8, or a plurality of strings typically found on an electric guitar. The sustain system is usually disposed on a counter-sunk portion of the upper surface of the body of the electric guitar so that the pickup 10 and driver 12 are in magnetic proximity to the string 8 of the instrument.

The pickup 10 and driver 12 are constructed generally similarly. Both the pickup 10 and the driver 12 are constructed of a number of turns of a conductor means, such as wire 13, 15 which is wound around a magnetic core 17, 19, respectively. The cores 17, 19 are generally either a permanent magnet, or a ferrous material in contact with a permanent magnet, to provide a permanent magnetic flux through the center of the respective pickup coil 13 and driver coil 15.

A condition that exists in all prior art sustain systems using a magnetic pickup and driver in conjunction with an amplifier to sustain string vibrations is that when the gain of the amplifier 14 is of a sufficiently high level to achieve sustain of the string 8, a portion of the driver's 12 magnetic field F is present at the pickup 10. The magnetic field F induces the pickup 10 to create a voltage. The pickup voltage is amplified and regenerated by the driver 12, which then is picked up by the pickup 10, to induce the pickup 10 to create a greater voltage. This cycle is known as "system oscillation." The frequency of these oscillations depends on the resonant frequencies of the electronic components in the feedback loop and thus has no musical relationship to the string vibration frequency.

A second problem associated with direct magnetic feedback between the driver and pickup is the contamination of the pickup signal with noise and distortion produced by the amplifier means. The presence of amplifier noise and distortion in the pickup signal produces an unnatural tone when the pickup is used in conjunction with a loudspeaker to monitor the tone produced by the vibrating string.

One common solution to the problem of direct magnetic feedback is to decrease the gain of the amplifier. However, this decrease in amplifier gain reduces the ability of the system to pickup and sustain slight string vibrations. Also, it takes longer for the oscillations of the string to build up to their steady-state amplitude.

Another prior art solution to the problem of direct magnetic feedback is to spatially separate the pickup and driver by a great distance. The pickup and driver may be placed at opposite ends of the strings. However, this solution precludes the use of frets.

U.S. Pat. No. 4,075,921 presents a method for overcoming the problem of direct magnetic feedback by providing the pickup and driver with a very small air gap between the magnetic poles. The commercially available E-bow sustain system, manufactured by Gregory A. Heet of Los Angeles, Calif. embodies this type of approach. One difficulty with this approach is that the strings must be in very close proximity to the pickup and driver, and the string's vibrational excursion must be minimized to avoid direct contact between the strings and the pickup and driver.

U.S. Pat. No. 3,742,113. introduces a method for reducing the problem of direct magnetic feedback by providing the pickup with a hum-bucking apparatus to cancel the effects of uniform external magnetic fields. One difficulty with such an approach is that the hum-bucking pickup does not provide optimum rejection of the non-uniform magnetic field generated by the driver due to the balanced design of the pickup. As will be appreciated, the driver's magnetic field is non-uniform, particularly in close proximity to the driver due to the inverse cube law of magnetic field intensity. This law provides that the magnetic field intensity becomes more uniform as the distance from the driver is increased.

The '113 patent also discloses a sustaining device which has two drivers spaced equidistant from a single-coil pickup so that the field they exert at the locus of the pickup is substantially zero. However, the drivers are mounted in a shield box formed of magnetic ingot iron, which indicates that the equidistant positioning of the drivers with respect to the pickup, by itself, does not provide adequate magnetic field cancellation at the pickup. Although the magnitudes of the magnetic fields generated by the drivers may be equal at the pickup, the relative phases of the signals generated by the drivers will tend to vary with frequency from 180 degrees out of phase, thus the signals that the drivers induce in the pickup coil will not exactly cancel. This is due to the tendency that the driver coils will have different complex impedances from each other.

U.S. Pat. No. 4,941,388 discloses a method for overcoming the problems of direct magnetic feedback by unbalancing a hum-bucking pickup to provide optimum field cancellation of the non-uniform magnetic field generated by the driver. The magnetic field generated by the driver induces signals in both of the pickups of a hum-bucking pair. However, the magnetic field strength occurring at one pickup is stronger than the magnetic field strength occurring at the other pickup. This is because the pickups are not placed equidistant to the driver. Rather, one pickup is closer to the driver than the other pickup. Thus the signal amplitudes of the two signals must be equal in order for them to cancel when they are added together. This is achieved by altering the inductance of one of the pickups or by providing the appropriate gain or attenuation means to either or both pickup signals so that the amplitudes of the two signals are substantially equal. One difficulty with this approach is that the means of providing gain or attenuation to the signals changes their relative phase as well as their amplitudes. Although the amplitudes may be made substantially equal, the relative phase between the two signals will differ from 180 degrees and thus the signals will not adequately cancel, especially for higher signal frequencies.

A second difficulty with the unbalancing method proposed in the '388 patent is that in order to sustain a plurality of strings using multiple drivers and multiple pickups, wherein each string has an associated driver and unbalanced humbucking pickup, the geometry accorded by any positioning of these components guarantees that some magnetic field interaction will occur between the driver of each string and each of the pickups of adjacent strings. This magnetic interference precludes positioning the pickups in close proximity to the drivers, thus excludes a compact design for such a sustaining device.

The '388 patent also discloses a method for avoiding the problems of magnetic interference between adjacent sustaining systems by using either a single driver in conjunction with multiple pickups or a single pickup in conjunction with multiple drivers. However the use of a single driver or a single pickup for a multiplicity of strings inhibits the ability of the device to sustain more than one string simultaneously. If a single driver is used, the magnetic field generated to drive one string damps the motion of the other strings. A similar effect results from driving separate drivers with a single pickup signal. Furthermore, there is non-uniform gain in the feedback of the sustaining device between different fret-positions, different frequencies, and different strings. This sustaining device will sustain only the string whose signal feedback has the greatest gain.

Another prior art method for overcoming direct magnetic feedback is to make the sustain system operate more efficiently so as to reduce the power, hence the magnetic field strength generated by the driver needed to sustain string vibrations. Such a device is described by Floyd Rose et. al. in U.S. Pat. No. 4,907,483, U.S. Pat. No. 5,123,324, and U.S. Pat. No. 5,233,123. The sustainer that Rose describes is arranged to compensate for the phase lag of the drive forces provided by the driver relative to the drive signal. The efficiency of this system is most noticeable at higher frequencies. Although the increased efficiency is noticeable, the reduction in the power needed to drive string oscillations is not so significant in reducing the power requirements of the system as to substantially reduce magnetic feedback in nearby pickups.

A prior art sustaining device first marketed by the applicant and T Tauri Research of Wilmette, Ill. in November 1988 is shown in FIG. 1B as including a magnetic pickup 20, a magnetic driver 22, and an amplifier 24 interposed in a circuit between the pickup 20 and the driver 22. The pickup 20 includes a pickup coil 23 wrapped around a magnetic core 25. The driver 22 includes a driver coil 21 wrapped around a magnetic core 28. The driver 22 is positioned such that its axis is parallel to the string 8 and perpendicular to the axis of the pickup 20. The magnetic core 28 includes two pole pieces 27 and 29 that are in close proximity to the string 8.

Because the driver 22 is oriented perpendicular to the pickup 20, the amount of magnetic flux generated by the driver 22 at the pickup 20 is minimized. Furthermore, the magnetic flux acting on the pickup 20 is symmetric with respect to the plane that bisects the height of the pickup coil 23, thus the signals generated in the pickup coil 23 by the driver's 22 magnetic flux tend to cancel. Because the pole pieces 27 and 29 are in close proximity to the string 8, both ends of the driver solenoid are used to drive the string's 8 vibrations. Thus less power is needed to drive the string 8, resulting in a reduction in magnetic flux generated by the driver 22 that will interfere with the pickup 20. Although T Tauri's sustaining device is effective in reducing magnetic interaction between the driver 22 and the pickup 20, a significant amount of magnetic interaction still occurs. This magnetic interaction can be further reduced when the single-coil pickup 20 is replaced by a standard dual-coil humbucking pickup (not shown). However, the amount of magnetic interaction between the dual-coil hum-bucking pickup and the driver 22 still interferes with the operation of the sustaining device, especially where the hum-bucking pickup and driver 22 are placed close to each other.

Although the above described attempts to solve the problem of direct magnetic feedback all perform their intended function to one extent or another, room for improvement still exists.

Thus it is one aspect of the present invention to provide a sustaining device which maximizes the ability to sustain the vibration of a string, while minimizing the effects of direct magnetic feedback associated therewith. This is accomplished by two methods: One method is to provide an efficient sustain system capable of providing a powerful sustaining effect with only a modest power input to the driver. The second method is to balance the pickup means whereby the signals induced in the pickup means by the drive means will cancel.

It is another aspect of the present invention to provide a sustaining device whose pickup means and drive means are positioned in close proximity to each other without suffering the adverse effects of magnetic feedback.

It is yet another aspect of the present invention to provide a sustaining device that is capable of sustaining multiple strings simultaneously.

SUMMARY OF THE INVENTION

In accordance with the present invention, a sustaining device is provided for prolonging the vibration of a string of a stringed musical instrument having a magnetic pickup means responsive to a change in the magnetic field caused by vibration of a string. The sustaining device comprises a magnetic string driver means in magnetic proximity to the pickup means. An amplifier means is coupled to the driver means for amplifying current from the pickup means to the driver means to impart sufficient magnetic drive energy to the driver means to produce sustained vibration of the string. One method for minimizing the response of the pickup means to the magnetic flux generated by the driver means is to provide a driver means that generates a more focused magnetic flux such that the magnetic interaction between the driver means and the pickup means is reduced. Another method for minimizing the response of the pickup means to the magnetic flux generated by the driver means is to provide a driver means that requires less electrical power to drive the string's oscillations, thus the reduction in magnetic flux generated by the driver means reduces the amount of magnetic interaction between the driver means and the pickup means. A third method for minimizing the response of the pickup means to the magnetic flux generated by the driver means is to provide a cancellation means that minimizes the response of the pickup means to the magnetic flux generated by the driver means.

In one aspect of the present invention the driver means is adapted so that both poles of the electromagnet drive the string's vibrations. The results of this adaptation to the driver are that the driver requires substantially less electrical power to drive the string's vibrations, and much of the external magnetic flux produced by the driver is focused on a segment of the string between the poles of the driver.

One feature of this aspect of the present invention is that a magnetic string driver is provided that includes a section of a toroidal solenoid of which at least one coil surrounds a magnetic core whose endpoles are both within close proximity to the string. This feature has the advantage that the magnetic flux generated by the driver external to the solenoid's core is largely confined to a small segment of the string between the poles of the driver. Thus magnetic interaction with the pickups is minimized. Another advantage of the semi-toroidal design of the driver solenoid is that the magnetic field intensity affecting the string is significantly greater than the magnetic field intensity of a straight solenoid having the same parameters of number of turns, cross-sectional area, current, and position relative to the string. Thus the power required to drive the string's oscillations is significantly less for the semi-toroidal solenoid driver than for the corresponding straight solenoid driver. The reduced power requirements correspond to reduced magnetic flux generated by the driver. Hence these results help to minimize direct magnetic feedback between the pickup means and the driver means. The output of a magnetic pickup may thus be amplified and delivered to the driver to regenerate and sustain the vibration of the string while the driver's resultant magnetic flux produces relatively little effect on the pickup.

In a second aspect of the present invention, a sustaining device comprised of a plurality of magnetic string drivers and a plurality of pickups is provided with a cancellation means which minimizes magnetic interaction between each pickup means and its associated driver, as well as minimizing magnetic interaction between each pickup means and all other drivers of the sustaining device.

One feature of this aspect of the present invention is that the pickup means includes a first pickup assembly and a second pickup assembly. The first and second pickup assemblies are positioned symmetrically equidistant with respect to each driver on the instrument such that the center of each pickup coil receives the same magnitude of magnetic flux generated by each of the drivers. If the first pickup assembly is identical to the second pickup assembly, then the signals induced in each pickup assembly by the drivers are identical, and they are added together 180 degrees out of phase so that the overall response of the pickup means to the magnetic flux generated by the driver means is substantially zero.

Because the first and second pickup assemblies are not identical, a cancellation means comprising phase-adjustment and amplitude-adjustment circuits may be used to adjust the signals at the outputs of either or both of the first and second pickup assemblies so that the amplitude of the signal from each pickup assembly resulting from the external magnetic flux generated by the driver means is equal, and the phase between the pickup signals from each pickup is substantially constant over a broad range of signal frequencies of the external magnetic flux such that these pickup signals cancel when they are combined. Thus the effects of direct magnetic feedback between the pickup means and the driver means are minimized.

Several different arrangements of the pickup assemblies are illustrated in which the pickup assemblies are positioned symmetrically equidistant with respect to the driver means. In one arrangement, the pickup assemblies are placed on opposite sides of the driver means. In one variation of this arrangement, one of the pickup assemblies includes a coil wrapped around a non-magnetized core which may be positioned below the surface of the instrument. In another arrangement, the first pickup assembly is stacked on top of the second pickup assembly such that the pickup assemblies are disposed symmetrically with respect to the plane that is the perpendicular bisector of the height of the driver means. The advantage of this arrangement as a hum-bucking pickup is that it occupies only the same amount of surface of the instrument as a single-coil pickup, yet this arrangement is insensitive to both uniform magnetic flux, and non-uniform magnetic flux generated by other drivers on the instrument.

In a third aspect of the present invention, an automatic level control means is used in the circuit between the pickup means and the driver means of two or more adjacent sustaining devices. The advantage of this aspect of the present invention is that the automatic level control means compensates for the effects of magnetic interaction caused by the damping of a string of the musical instrument by the magnetic flux generated by an adjacent driver.

In a fourth aspect of the present invention, the method of balancing the pickup arrangements is used to reduce the response of the pickup means to the string vibrations as well as to the magnetic flux generated by the driver means while the string is not being played. The pickup means of the sustaining device includes one or more magnetic cores and two wires wound around each core in opposite directions. The two wires are connected in series. At the point where the two wires are connected is also a connection to an electrically conductive string of the musical instrument. The musical instrument also includes a fretboard whose frets are connected to electrical ground.

The advantage of the fourth aspect of the present invention is that when the string is not in contact with a fret, the output signal from the pickup means is substantially zero. This is because the signals from the coils that are wound around each pickup core in opposite directions will cancel whether those signals induced in the coils are from the vibration of the string or the magnetic flux generated by the driver means. When the string is in contact with one of the grounded frets, the signal from one of the coils wrapped around the pickup core will be grounded. Thus the pickup will produce a non-zero net signal which enables the driver to sustain the string. This non-zero net signal will not include the effects of the magnetic flux generated by the driver if the pickup means includes a cancellation means. The sustaining device will only sustain strings that touch one of the grounded frets, thus the musician does not need to suppress the vibrations of open strings while playing the instrument.

In a fifth aspect of the present invention, the driver coil that is wound around the driver means is connected to an electrically conductive string of the musical instrument. The string is electrically open and the fretboard of the instrument is connected to electrical ground. The pickup means includes a cancellation means to cancel responses of the pickup means to the magnetic flux generated by current in the string and connecting wires, as well as the driver means.

The advantage of this aspect of the present invention is that when the string is not in contact with a fret, the sustaining device will not sustain the string. When the string touches one of the grounded frets, the circuit of the sustaining device is closed. Current will flow through the coil of the driver and cause the string's vibrations to be sustained. An additional advantage of this aspect of the invention is that the current in the string interacts with the magnetic flux generated by the driver means to help sustain the string's vibrations.

In a variation of the fifth aspect of the present invention, a line connects the positive input power terminal of the amplifier means to an electrically conductive string of the musical instrument. The string is electrically open and the fretboard is connected to the positive terminal of a power supply. The pickup means includes a cancellation means to cancel the responses of the pickup means to sources of external magnetic flux, which include the string, the wires that connect the string to the amplifier means, and the driver itself. When the string makes contact with one of the frets, current is supplied to the amplifier means. The amplifier means provides a signal to the driver means that generates sufficient magnetic flux to sustain the vibrations of the string. The current in the string interacts with the driver's magnetic flux to provide additional driving force to the string.

In a sixth aspect of the present invention, a driver means is provided that includes a first driver assembly and a second driver assembly. The driver assemblies are arranged symmetrically equidistant with respect to a pickup means. A cancellation means comprising phase and amplitude-adjustment circuits are provided to adjust the magnetic flux generated by each of the first and second driver assemblies so that they are equal and substantially out of phase for a broad range of signal frequencies.

In a seventh aspect of the present invention, a pickup means bridges a plurality of strings of a stringed musical instrument. The pickup means is connected to a plurality of amplifier circuits, each of which is associated with a single driver means and associated with a single string. The pickup means is balanced with respect to each of the drivers. Each circuit between the pickup means and each driver means includes an adjustable level control circuit that is set so that the gain of the feedback loop between the pickup means and each of the driver means is substantially equal.

The advantage of this aspect of the present invention is that the adjustable gain control means helps to compensate for the damping of each string by the magnetic flux generated by drivers of adjacent strings, and the damping caused by the string being driven at frequencies of vibration of other strings. This compensation allows a sustaining device to more effectively sustain a plurality of strings simultaneously.

In an eighth aspect of the present invention, a hand-held sustaining device illustrates how the cancellation methods discussed above can be used to substantially minimize the size of a sustaining device. Reduction in the magnetic interference between the pickup means and the driver means allows the pickup and driver to be positioned close to one another. The hand-held sustaining device of the present invention includes a pickup assembly and driver that may be held along with a pick when plucking the strings of the instrument. The amplifier means, batteries, and other bulky components of the sustaining device may be strapped to the wrist of the musician, or be positioned otherwise to avoid interfering with the playing of the instrument.

These and other features of the present invention will become apparent to those skilled in the art upon consideration of the following detailed descriptions of the preferred embodiments exemplifying the best mode of carrying out the invention as perceived presently.

BRIEF DESCRIPTION OF THE DRAWINGS

FIG. 17 is a schematic view of a preferred embodiment of the present invention that depicts a balanced pickup means being utilized in a sustain device where each string has an associated driver, but each pickup assembly bridges all of the strings.

DETAILED DESCRIPTION OF PREFERRED EMBODIMENTS

Figure 2A:
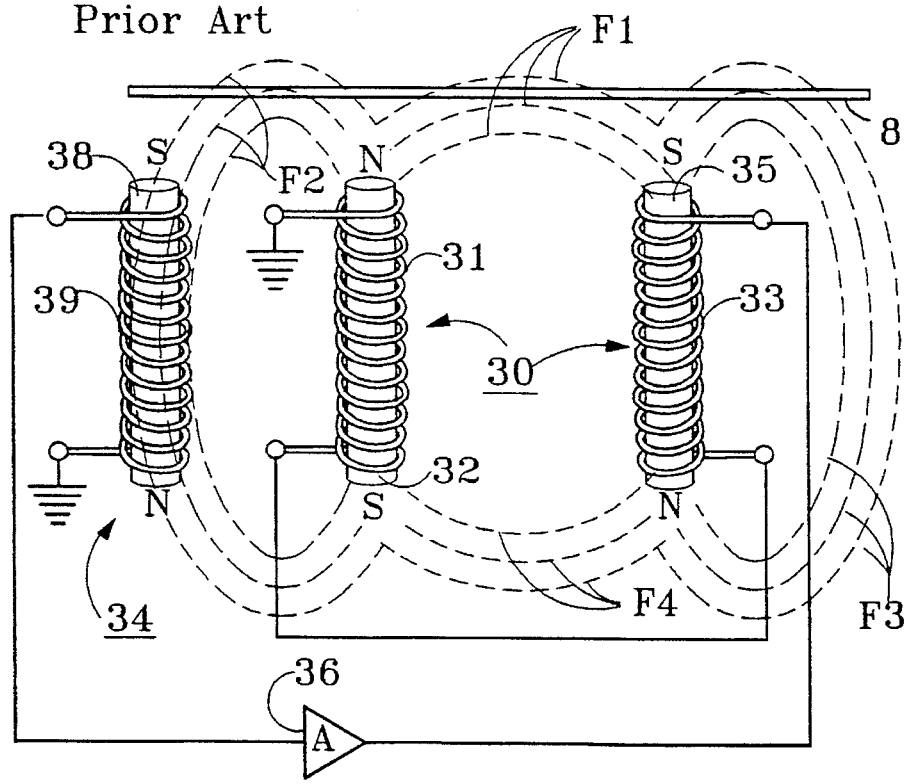
FIG. 2A is a schematic view of a dual-coil driver of a prior art sustain circuit that illustrates the phenomena of direct magnetic feedback.

A prior art sustaining device is shown in FIG. 2A as including a magnetic pickup 34, a dual coil magnetic driver 30, and an amplifier 36 interposed in the circuit between the pickup 34 and the driver 30. The pickup 34 is typically comprised of one or more pickup coils, such as pickup coil 39. The dual coil driver 30 is comprised of a driver coil 31 wound around magnetic core 32, whereas a driver coil 33 having the same number of turns is wound in the opposite direction around magnetic core 35. These driver coils 31 and 33 are connected in series. The driver coils 31 and 33 could also be connected in parallel (not shown). The connection is arranged so that a voltage of one polarity applied across the parallel connected driver coils 31 and 33 will produce an upwardly directed flux from driver coil 31 and a downwardly directed flux from driver coil 33, thus reinforcing the flux in both ferromagnetic elements 32 and 35, whereas a voltage of the opposite polarity will produce the opposite effect, thus counteracting the flux in both ferromagnetic elements 32 and 35.

Figure 1A:
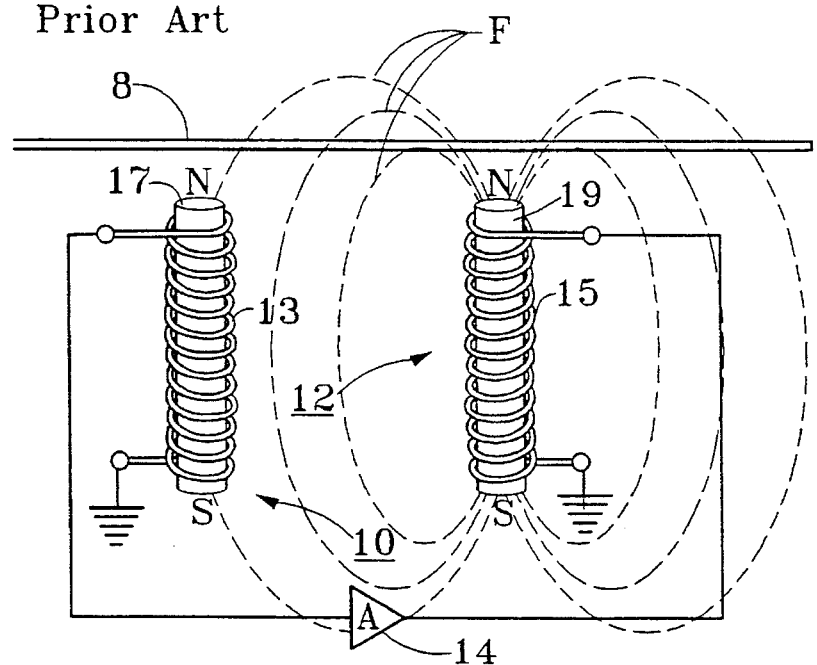
FIG. 1A is a schematic view of a prior art sustain circuit that illustrates the phenomena of direct magnetic feedback.
Figure 1B:
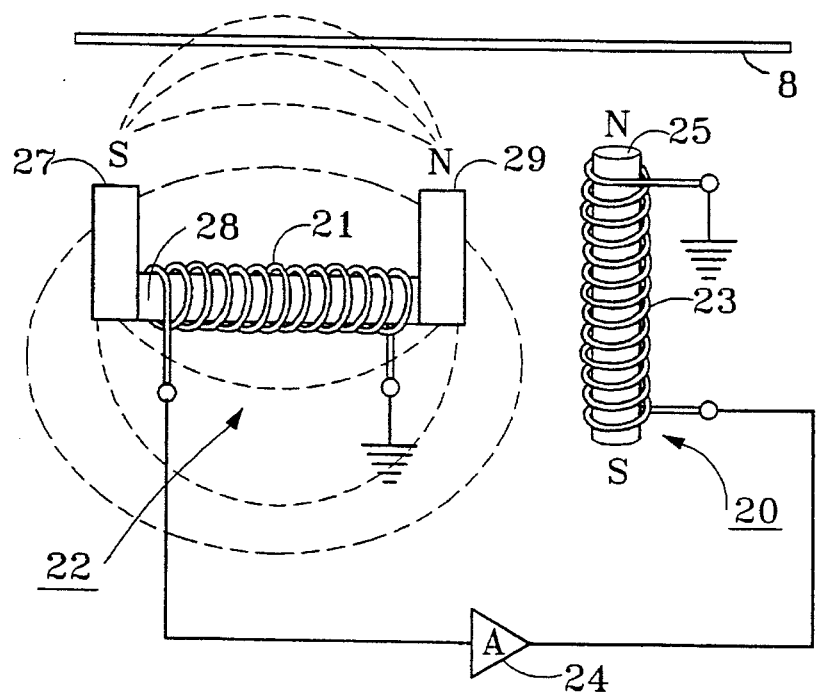
FIG. 1B is a schematic view of a prior art sustain circuit that addresses the problem of direct magnetic feedback.

The dual-coil driver 30 of FIG. 2A provides substantially stronger magnetic driving capability than the single-coil driver 12 of FIG. 1A for a given current flow. It is believed that this results from the added magnetic flux intensity at the string 8 accorded by the geometry of the dual coil driver 32. A portion of the magnetic field produced by driver solenoid 33 is drawn toward the magnetized core 32 of the driver solenoid 31. This is represented by magnetic field contour F1. The magnetic flux imparted by the two coils 31 and 33 reinforce one another and provides more magnetic field intensity at the string than the sum of two separate drivers. This is due, in part, to the magnetic field F1 impinging on the string 8 within much of the space that it occupies between the endpoles of the cores 32 and 35.

Magnetic field contour lines F4 represent magnetic fields produced between the dual coil driver which do not interact with the string. Magnetic field contour lines F2 and F3 represent magnetic fields produced by each of the drivers that return to their respective cores. Magnetic interaction between the dual coil driver 30 and the pickup 34 is represented by a portion of the magnetic field F2 from the dual-coil driver 30 that passes through the core 38 of pickup 34. It was discovered through experiment that when we changed the position of the two drivers of the dual-coil driver 30 relative to each other we observed two effects: When the drivers were moved closer together the sustaining ability of the system was improved and the magnitude of magnetic interference between the pickup 34 and the dual-coil driver 30 was reduced. It is apparent that these results can be attributed to the magnetic field F1 increasing and magnetic fields represented by F2 and F3 decreasing. Thus the following invention relates to a magnetic driver in which the associated magnetic field intensity F1 is maximized and the associated "stray" magnetic fields F2 and F3 are reduced.

Figure 2B:
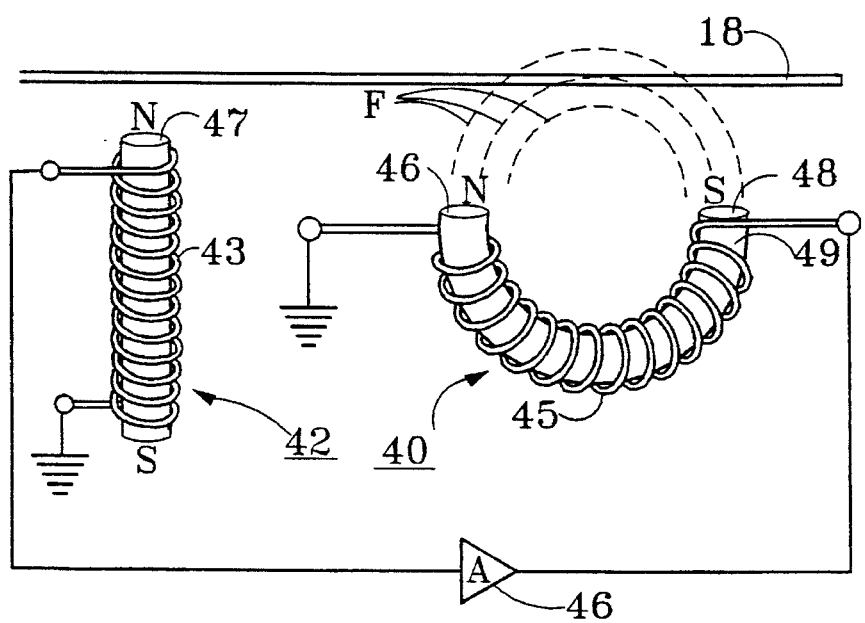
FIG. 2B is a schematic view of an embodiment of the sustain circuit of the present invention which illustrates the reduction in direct magnetic feedback.

An embodiment for a sustaining device of the present invention is shown in FIG. 2B. The circuit in FIG. 2B includes a pickup 42, an amplifier 46, and a driver 40. The coil 45 of the driver 40 is a section of a solenoidal toroid that surrounds a magnetic core 49. Magnetic core 49 is a section of a closed loop, in this case a circle, which has both of its pole pieces 46 and 48 in close proximity to the string 18. However it will be appreciated that magnetic core 49 could be a section of an oval, an ellipse, or any such closed loop. A voltage of one polarity applied across the driver coil 45 will produce an upwardly directed magnetic flux from the driver coil 45 at the pole piece 46 and a downwardly directed magnetic flux from the driver coil 45 at pole piece 48, thus reinforcing the flux in both pole pieces 46 and 48, whereas a voltage of the opposite polarity will produce the opposite effect, thus counteracting the flux in both pole pieces 46 and 48. This is because the portions of wire on one side of the coil 45 are inherently reversed in direction from portions on the other side. Electrical impulses in the driver coil 45 will induce magnetic fields in the core 49 which are additive, thus doubling the output magnetic field strength impinging on the string 18. Magnetic field contour lines F represent the magnetic field produced between the pole pieces 46 and 48 of the driver 40. It can be appreciated by this representation of magnetic field strength outside the driver 40 that for a given magnetic field strength B inside the core material 49, the design of the driver 40 of the present invention provides greater magnetic field interaction with the string 18 and reduced magnetic interaction between the driver 40 and the pickup 42 than would a single linear-solenoid magnetic driver.

Figure 3:
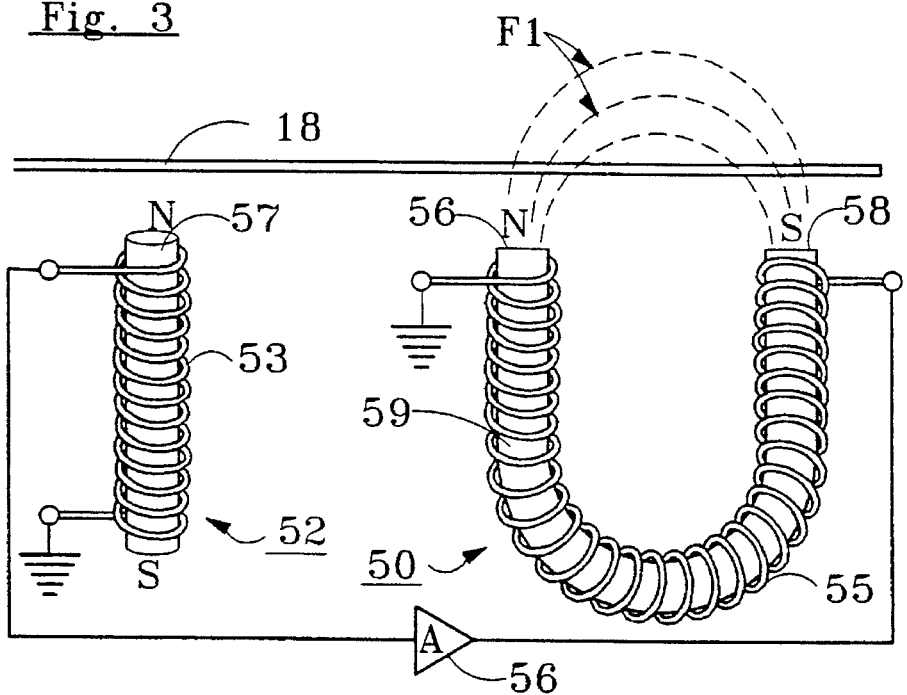
FIG. 3 is a schematic view of a preferred embodiment of a driver of the present invention.

Another embodiment for a sustaining device of the present invention is shown in FIG. 3. The circuit of FIG. 3 includes a pickup 52, an amplifier 56, and a driver 50. The driver coil 55 is a section of a solenoidal toroid that surrounds magnetic core 59. Magnetic core 59 in this case is U-shaped. The design of this driver is meant to be similar to a dual-coil linear solenoid driver, such as the driver 32 shown in FIG. 2A except that it includes a section of toroidal solenoid that connects the two linear solenoids together. Another aspect contributing to the high degree of efficiency of the invented driver 50 is the focusing of the magnetic field within a string segment. Magnetic field contour lines F1 represent the magnetic field produced between the endpoles 56 and 58 of the driver 50. This magnetic field is largely confined to the space between the endpoles and has significant interaction with the string 18. The absence of magnetic fields F2, F3, and F4 illustrates how this driver 50 makes more efficient use of its power to drive the string 18. The magnetic field lines in FIG. 3 also illustrate how magnetic interaction with the pickup 52 has been minimized. Because the magnetic fields produced by the driver 50 drive the string's 18 vibration more effectively, less power is needed to sustain the string's 18 vibration than would be used by a single or dual coil linear-solenoid magnetic driver. Less magnetic flux is needed to drive the string 18, thus magnetic interaction with the pickup 52 is further reduced. Although the advantage of using this driver 50 with a magnetic pickup 52 has been demonstrated, it will be appreciated that the utility of this driver 50 is not limited to use with magnetic pickups in which magnetic interaction is problematic. This driver 50 could also be used with any such non magnetic pickup means or magnetic pickup means that has been adapted to minimize its response to external magnetic flux.

In a variant of the driver 50 illustrated in FIG. 3, the core 59 may consist of one or more ferromagnetic elements in contact with one or more permanent magnets. In a further variant, core 59 consists of separate cores that are magnetized so as to provide the same flux directions as discussed above viz., upwardly from the endpole 56 and downwardly into the endpole 58. Also, the flux directions of both poles 56 and 58 could be reversed.

Figure 4:
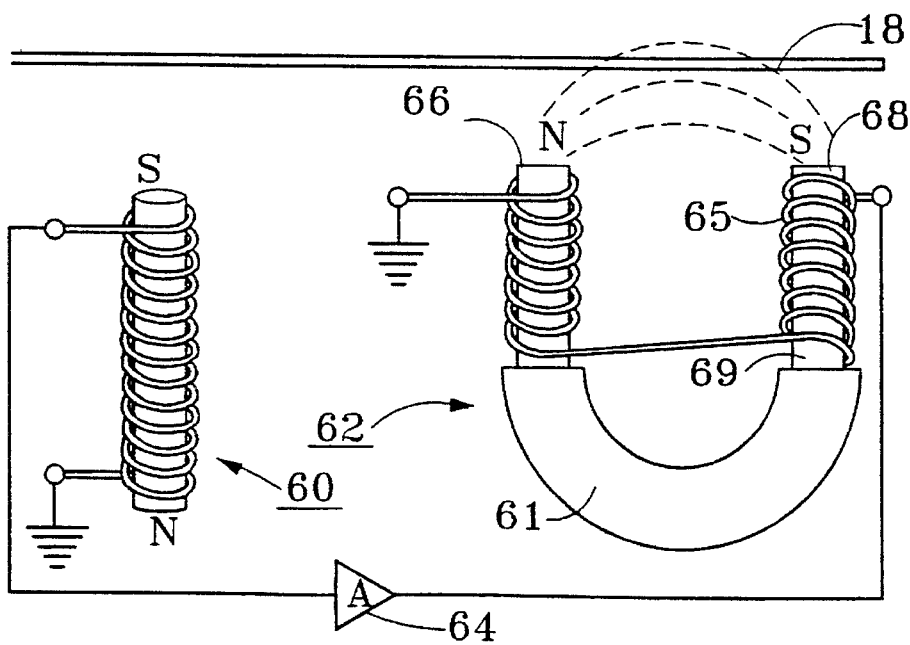
FIG. 4 is a schematic view of a circuit of another embodiment of the present invention.

Another embodiment of the present invention is shown in FIG. 4, which includes a pickup 60, an amplifier 64, and a driver 62. The coil 65 of driver 62 is wound around one arm of the magnetic core 69. The coil 65 is wound in the opposite direction with the same number of turns around the other arm of magnetic core 69. These two sections of driver coil 65 are connected in series. However it will be appreciated that these two sections of driver coil 65 could be connected in parallel. The section of magnetic core 69 that is not surrounded by coil 65 is enclosed by a magnetic shield 61, which helps confine the magnetic field to the core 69. It will be appreciated that magnetic shielding can be used in addition to, as well as in place of coils to help confine the magnetic field to the core material.

Figure 5A:
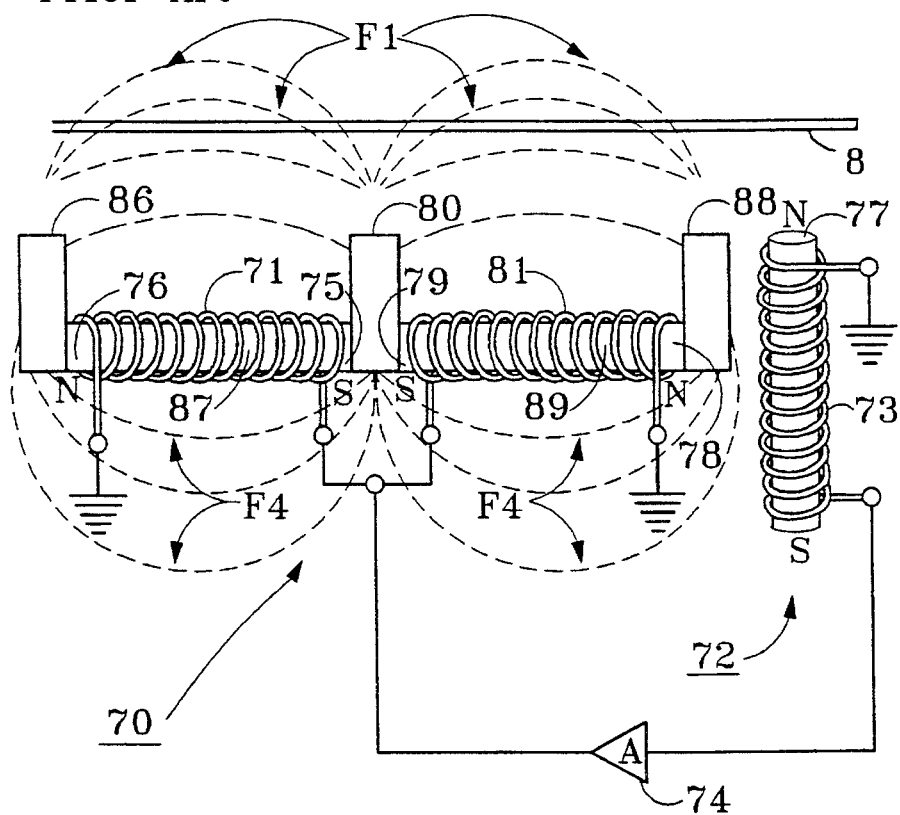
FIG. 5A is a schematic view of a preferred embodiment of a driver of the prior art sustaining device shown in FIG. 1B.

The prior art sustaining device shown in FIG. 5A was first marketed by the applicant and T Tauri Research of Wilmette, Ill. in November, 1988. The sustaining device of FIG. 5A includes a pickup means 72, a magnetic driver means 70, and an amplifier 74 interposed in the circuit between the pickup 72 and the driver 70. The pickup 72 is comprised of one or more pickup coils 73 wrapped around a magnetic core 77. The driver 70 is comprised of a driver coil 71 wrapped around a magnetic core 87 and a driver coil 81 wrapped in the opposite direction around magnetic core 89. In this case the driver coils 71 and 81 are connected in parallel. The driver coils 71 and 81 are positioned such that the normal to the plane of coils 71 and 81 is parallel to the lengthwise dimension of the string 8. The magnetic driver 70 also includes pole pieces 80, 86, and 88. Pole piece 80 connects the endpole 75 of magnetic core 87 to the endpole 79 of magnetic core 89. In this case the endpole 75 of core 87 has the same polarity as the endpole 79 of core 89. However this design was also utilized with endpoles 75 and 79 having opposite polarities. Pole piece 86 is in contact with the end pole 76 of the magnetic core 87 and pole piece 88 is in contact with the end pole 78 of the magnetic core 89.

Pole pieces 80, 86, and 88 are in close proximity to the string 8 so that much of the magnetic field generated by the driver 70 impinges on the string 8. Magnetic field contour lines F1 represent magnetic fields generated by the driver 70 which impinge on the string 8. Magnetic field contour lines F4 represent magnetic fields generated by the driver 70 which do not interact with the string 8. Although the driver 70 of FIG. 5A reduces the magnetic interference at the pickup 72 and produces a significantly improved magnetic field intensity at the string 8 compared to other prior art drivers, there is still room for improvement, as indicated by the presence of magnetic field lines F4 that do not impinge on the string 8.

Figure 5B:
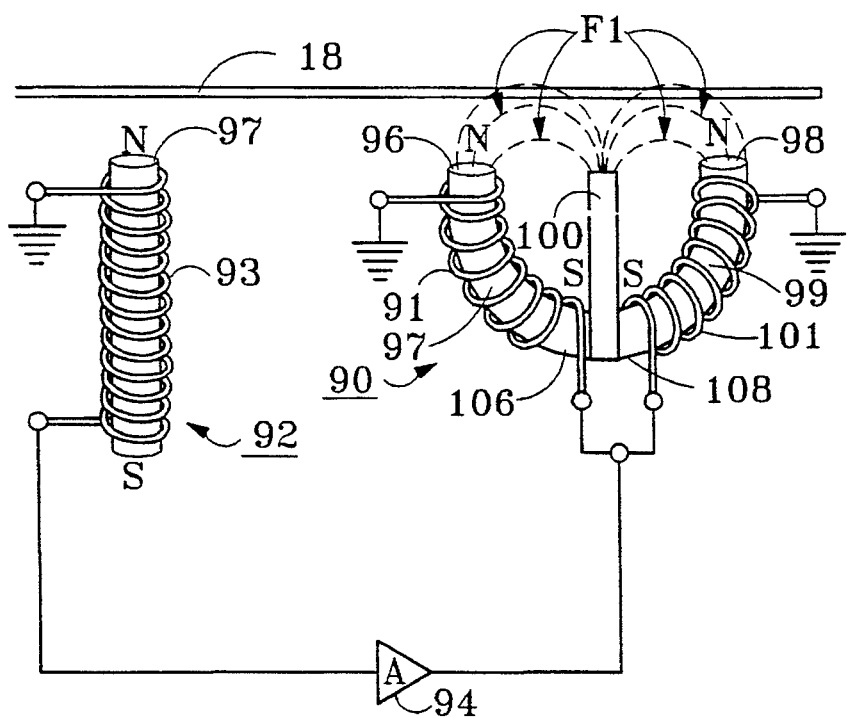
FIG. 5B is a schematic view of a preferred embodiment of a driver of the present invention.

An embodiment for a sustaining device of the present invention is shown in FIG. 5B as including a pickup means 92, a magnetic driver means 90, and an amplifier means 94 interposed in the circuit between the pickup 92 and the driver 90. The pickup 92 is comprised of one or more pickup coils 93 wrapped around magnetic core 97. The driver 90 is comprised of a section of a toroidal solenoid, coil 91, wrapped around magnetic core 97, and another section of a toroidal solenoid, coil 101, wrapped in the opposite direction around magnetic core 99. In this case coil 91 and coil 101 are connected in parallel, however it will be appreciated that driver coils 91 and 101 could be connected in series. Each core 97 and 99 is a section of a closed loop, in this case a circle. However it will be appreciated that magnetic cores 97 and 99 could be sections of an oval, an ellipse, or any such closed loop. Furthermore, core 97 may be a section of one kind of closed loop whereas core 99 could be a section of another kind of closed loop. The driver 90 also includes pole piece 100. Pole piece 100 connects endpole 106 of core 97 to endpole 108 of core 99. In this case endpoles 106 and 108 have similar polarities, however it will be appreciated that endpoles 106 and 108 may have opposite polarities. The endpoles 96 and 98, and a portion of pole piece 100 are in close proximity to the string 18.

Magnetic field contour lines F1 represent the magnetic fields generated by the driver which impinge on the string 18. The absence of magnetic field lines F4 indicates that the amount of magnetic field generated by the driver 90 that does not impinge on the string 18 is greatly reduced from the amount of magnetic field F4 produced by the prior art driver 70 of FIG. 5A that is not utilized to sustain the string's 8 vibration. The driver 90 of FIG. 5B utilizes more of its energy than does the prior art driver 70 of FIG. 5A to drive the string 18. The driver 90 of the present invention thus requires less power to drive the string 18 and produces less magnetic interference at the pickup 92.

Figure 6A:
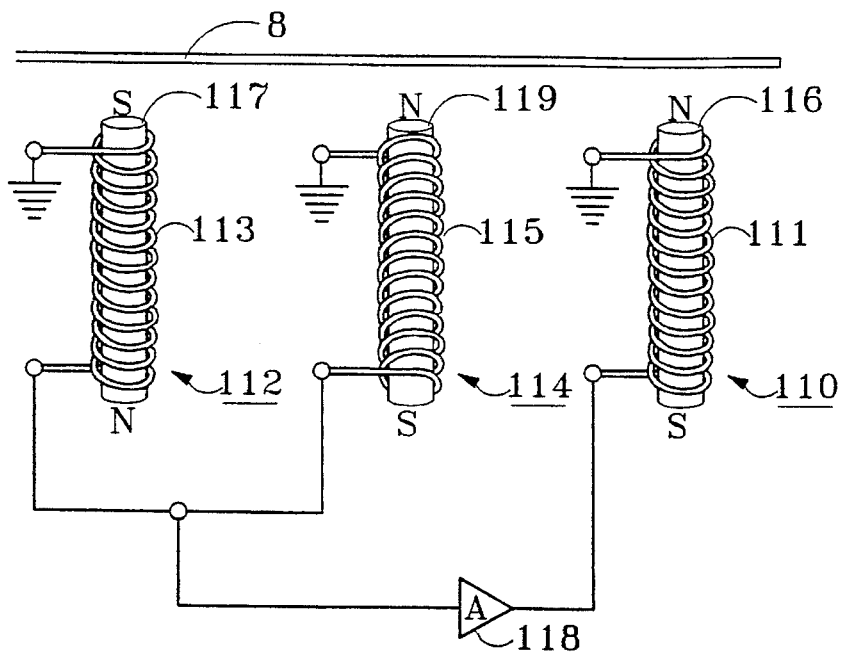
FIG. 6A is a schematic view depicting the arrangement of a single prior art sustain circuit.

A typical prior art sustaining device is shown in FIG. 6A as including a magnetic driver 110, an amplifier 118, and a pickup means which is comprised of two pickups 112 and 114. Pickup coil 113 is wound around a magnetic core 117, whereas a pickup coil 115 is wound in the opposite direction around a magnetic core 119. The magnetic flux impinging on the first pickup 112 is proportional to the inverse of the cube of the distance from the first pickup 112 to the source of the magnetic flux, driver 110. Likewise, the magnetic flux impinging on the second pickup 114 is proportional to the inverse of the cube of the distance from the second pickup 114 to the driver 110. The impedance of each of the pickup coils 113 and 115 may be represented by a complex number: $Z=X+IY$. The voltage of the induced current in the pickup coils 113 and 115 will have a magnitude related to the magnitude of the impedance Z and will precede or follow the current by a phase angle of arctan (Y/X). For a typical pickup coil at audio frequencies, the real part X of impedance Z is given by the resistance R of the coil. The imaginary part Y of the impedance Z is dominated by the contribution of the coil's inductance L, and is thus proportional to the frequency of the signal. The capacitive effects of the coil tend to be negligible except at high frequencies well above the audio range. A potential difference across the pickup enables the adjustment of the phase of the pickup's output signal by adjusting the effective resistance or reactance of the pickup.

As described by the '388 patent, the pickups 112 and 114 may be "unbalanced" such that the magnitudes of the pickup signals from pickup coil 113 and pickup coil 115 that are induced by the magnetic driver 110 are equal. This is accomplished by amplifying or attenuating one or both pickup signals. When these signals are added together 180 degrees out of phase they will cancel. However the method of unbalancing the pickups 112 and 114 tends to change the relative phase of the pickup signals as well as their magnitudes so that the pickup signals will not quite cancel when they are combined. This effect is particularly problematic at higher frequencies. Because the relative phase between the pickup signals of pickup coils 113 and 115 changes with respect to the frequency of those signals, the method of unbalancing the pickups 112 and 114 results in poor compensation for the effects of direct magnetic feedback over even a limited range of frequencies.

Figure 6B:
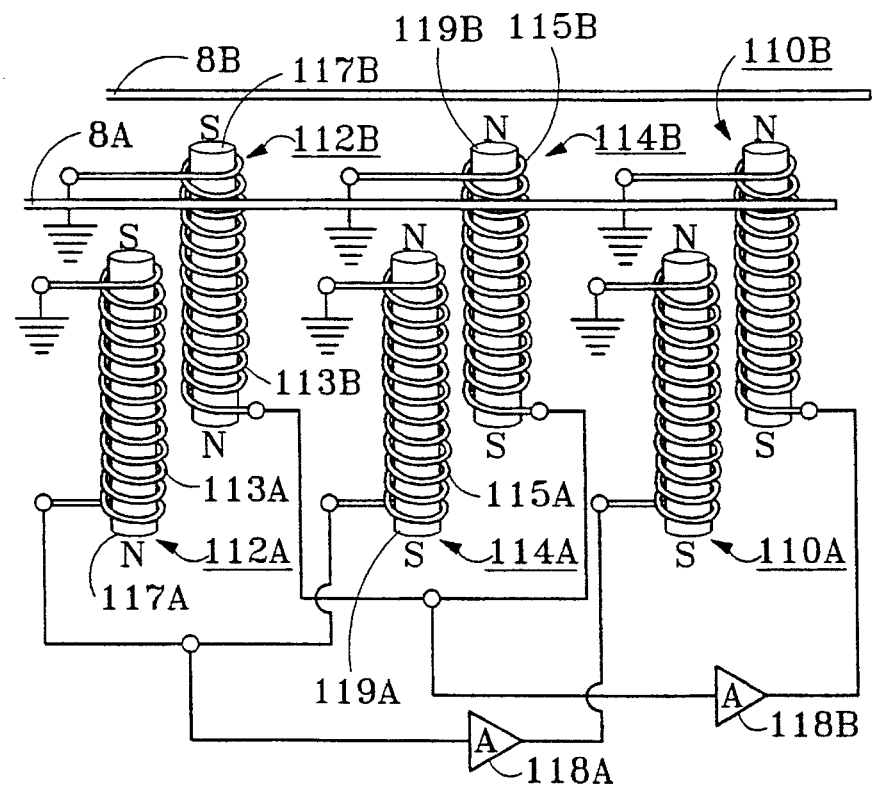
FIG. 6B is a schematic view depicting the arrangement of a plurality of prior art sustain circuits for sustaining a plurality of strings.

The positioning of a multiplicity of prior art sustaining devices of FIG. 6A is shown in FIG. 6B. The sustaining device of FIG. 6B is shown as being used with an instrument having two strings 8A and 8B. The sustaining device associated with string 8A includes two pickups 112A and 114A, a driver 110A, and an amplifier 118A coupled between the pickups 112A and 114A, and driver 110A. The sustaining device associated with string 8B includes two pickups 112B and 114B, a driver 110B, and an amplifier 118B coupled between the pickups 112B and 114B, and driver 110B. Pickup 112A includes a pickup coil 113A wrapped around a first magnetic core 117A. Pickup 114B includes a pickup coil 115A wrapped around a second magnetic core 119A. Pickup 112B includes a pickup coil 113B wrapped around a first magnetic core 117B. Pickup 114B includes a pickup coil 115B wrapped around a second magnetic core 119B. The circuit including pickups 112A and 114A, amplifier means 118A, and driver means 110A act on string 8A to sustain its vibration. Likewise, the circuit including pickups 112B and 114B, amplifier means 118B, and driver means 110B acts on string 8B to sustain its vibration.

The voltage V1$a$ of the signal induced in pickup coil 113A of pickup 112A by the magnetic flux generated by driver means 110A is smaller than the voltage V2$a$ of the signal induced in pickup coil 115A of pickup 114A by the magnetic flux generated by driver means 110A. If R1 is the distance between the center of pickup coil 113A and the center of the driver means 110A and R2 is the distance between the center of pickup coil 115A and the center of driver means 110A, then the ratio V1$a$/V2$a$ equals $R1^3/R2^3$. Either or both voltages V1$a$ and V2$a$ are adjusted by amplification, attenuation, manipulation of the design of the pickup means, or a combination of two or more of these methods such that the signal magnitudes of voltages V1$a$ and V2$a$ are made nearly equal. The ratio of gains G1$a$ and G2$a$ applied to voltages V1$a$ and V2$a$ respectively in order to make them equal is G1$a$/G2$a$=V2$a$/V1$a$=$R1^3/R2^3$. Then the voltages V1$a$ and V2$a$ should be combined out of phase such that they cancel. However, the voltage V1$ab$ induced in the pickup coil 113A of pickup 112A by the magnetic flux generated by driver means 110B is proportional to $1/(R1^2+D^2)^{3/2}$, where D is the separation between the centers of driver means 110A and driver means 110B. The voltage V1$ab$ induced in the pickup coil 115A of pickup 114A by the magnetic flux generated by driver means 110B is proportional to $1/(R2^2+D^2)^{3/2}$. The ratio of gains required to compensate for the magnetic flux in the pickups 112A and 114A generated by the adjacent driver 110B is G1$a$/G2$a$=V2$ab$/V1$ab$=$(R1^2+D^2)^{3/2}/(R2^2+D^2)^{3/2}$. However, if the gains G1$a$ and G2$a$ already compensate for the magnetic flux generated by the driver means 110A, then the magnetic flux generated by the driver means 110B will produce a non-zero signal in the net output of pickups 112A and 114A unless D=0 or R1=R2. Furthermore, as pickups 112A and 114A and pickups 112B and 114B are positioned closer to driver means 110A and driver means 110B, respectively, the magnetic interference experienced by the sustaining device increases substantially.

It may be noted that if the multiple drivers 110A and 110B of FIG. 6B were replaced by a single driver that bridges all of the strings, or if each set of multiple pickups 112A and 112B, and 114A and 114B were replaced by a single pickup that bridges all of the strings 8A and 8B, the condition R1=R2 would be satisfied. However, in order to sustain multiple strings simultaneously, it is advantageous to use multiple pickups in combination with multiple drivers such that each string has an associated pickup means and driver means. If a single driver is used to sustain a plurality of strings, the magnetic flux generated to drive one string tends to damp out the vibrations of the other strings. The same result occurs if each of a multiplicity of drivers is fed a common signal from a single pickup. Furthermore, it takes less magnetic energy to sustain a larger-diameter string than to sustain a smaller-diameter string. Thus the sustaining device will tend to favor the oscillations of larger-diameter strings over smaller-diameter strings. Likewise, the sustaining device will favor certain frequencies above other frequencies in accordance with specific phase relationships within the sustaining device circuit components.

Figure 6C:
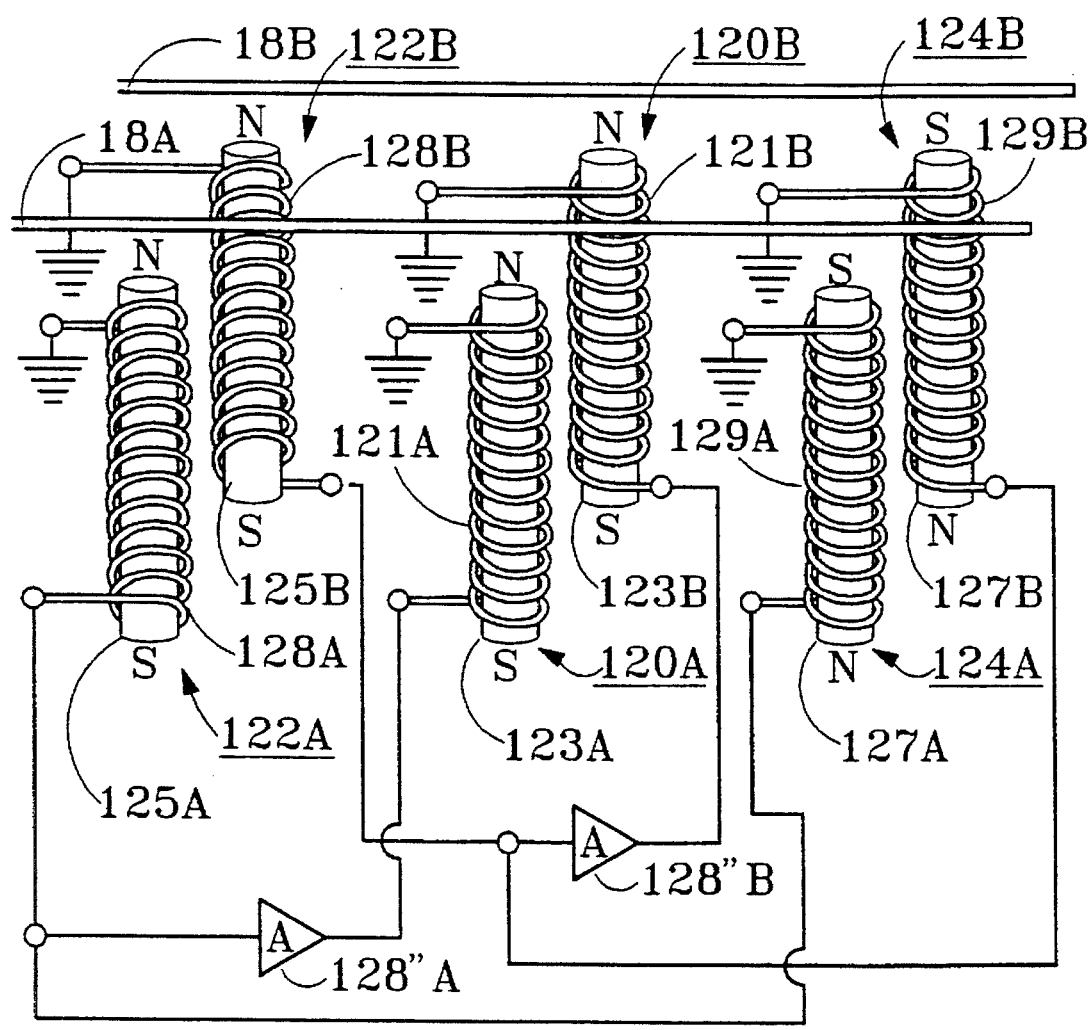
FIG. 6C is a schematic view depicting the arrangement of a plurality of sustain circuits of the present invention.

An embodiment for a sustaining device of the present invention is shown in FIG. 6C. The circuit in FIG. 6C includes a first pickup means that includes two pickups 122A and 124A, and a driver means 120A disposed in a plane parallel to the surface of the instrument. An amplifier means 128A is coupled between the pickup means 122A and 124A, and the driver means 120A. The circuit in FIG. 6C also includes a second pickup means that includes two pickups 122B and 124B, and a driver means 120B disposed in a plane parallel to the surface of the instrument. An amplifier means 128B is coupled between the pickup means 122B and 124B and the driver means 120B. Each driver means, such as drivers 120A and 120B are positioned in a line that is generally perpendicular to the lengthwise dimension of the strings of the instrument. Driver means 120A includes a magnetic core 123A around which is wrapped a driver coil 121A. Driver means 120B includes a magnetic core 123B around which is wrapped a driver coil 121B. Pickups 122A and 124A are placed symmetrically with respect to drivers 120A and 120B so that the pickups 122A and 124A are equidistant to driver 120A and equidistant to driver 120B. Pickups 122B and 124B are also placed symmetrically with respect to drivers 120A and 120B so that the pickups 122B and 124B are equidistant to driver 120A and equidistant to driver 120B. The first pickup 122A associated with string 18A includes a pickup coil 128A wrapped around a magnetic core 125A a predetermined number of turns, N. The second pickup 124A associated with string 18A includes a pickup coil 129A wrapped in the opposite direction around a magnetic core 127A the same number of turns, N. The first pickup 122B associated with string 18B includes a pickup coil 128B wrapped around a magnetic core 125B a predetermined number of turns, N. The second pickup 124B associated with string 8B includes a pickup coil 129B wrapped in the opposite direction around a magnetic core 127B the same number of turns, N. The complex signal response Z1A of pickup 122A is assumed equal to the complex signal response Z2A of pickup 124A. Likewise, the complex signal response Z1B of pickup 122B is assumed equal to the complex signal response Z2B of pickup 124B. The first and second pickup coils 128A and 129A associated with string 18A are connected in parallel, and the first and second pickup coils 128B and 129B associated with string 8B are connected in parallel. It will be appreciated that pickup coils 128A and 129A, and pickup coils 128B and 129B could also be connected in series.

Both pickup coils 122A and 124A are in sufficient magnetic proximity to the driver 120A so as to be influenced by the magnetic flux generated by the driver coil 121A. Furthermore, both pickup coils 122A and 124A are also in sufficient magnetic proximity to any other drivers, such as driver 120B that may be used to sustain adjacent strings so as to be influenced by the magnetic flux generated by those drivers. Likewise, pickup coils 122B and 124B are in sufficient magnetic proximity to drivers 120B, 120A, and any other drivers of the sustaining device so as to be influenced by their magnetic flux. Since both pickup coils 122A and 124A are symmetrically equidistant to the driver 120A, they receive the same proportion of the driver's 120A magnetic flux in their magnetic cores 125A and 127A respectively. Additionally, both pickup coils 122A and 124A are symmetrically equidistant to the drivers of the adjacent strings, such as driver 120B associated with string 18B. Thus the pickup coils 122A and 124A receive the same proportion of magnetic flux generated by the drivers of adjacent strings, such as driver 120B of string 18B. Because of this arrangement, the voltage produced by pickup 122A in response to the magnetic flux generated by driver 120A or an adjacent driver, such as driver 120B will be equal in magnitude but 180 degrees out of phase to the voltage produced by pickup 124A in response to the magnetic flux generated by driver 120A or an adjacent driver, such as driver 120B.

The magnetic field generated by driver 120A may tend to damp the vibration of an adjacent string, such as string 18B. Also, as the string 18A is displaced from the center of the driver 120A, such as when a musician bends the string 18A, the magnetic flux generated by the driver 120A that impinges on the string 18A diminishes. Therefore, when the musician bends the string 18A beyond the center of the driver 120A, it becomes more difficult for the sustainer to drive the string's 18A vibrations, thus the amplitude of the string's 18A vibrations will diminish. Each amplifier means of the sustaining device, such as amplifier 128A may include an automatic level control, such as a compressor circuit (not shown) that will compensate for the reduction in the string's 18A response to the driver's 120A magnetic flux which can occur when the musician bends the string 18A, when the string 18A is fretted on the lower frets, or when an adjacent driver, such as driver 120B is operating.

Figure 7:
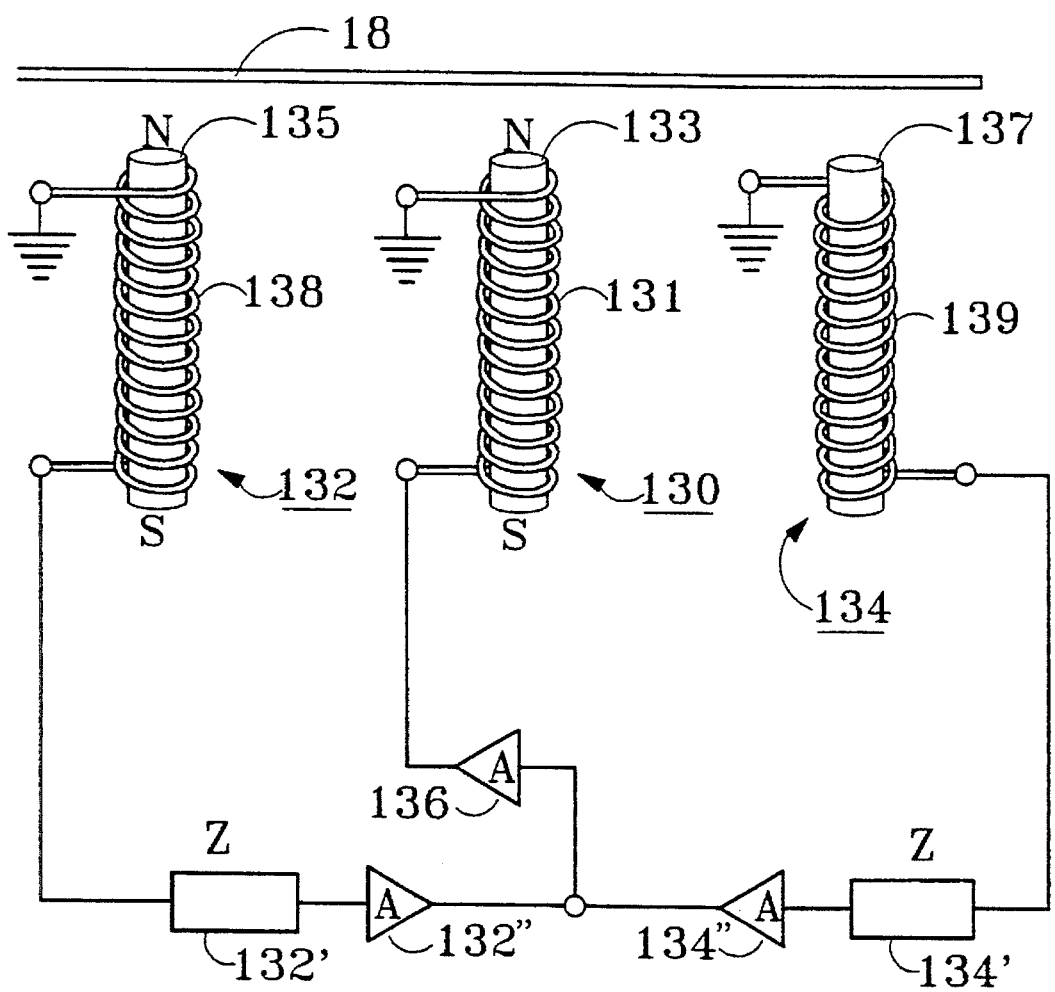
FIG. 7 is a schematic view of an embodiment of the present invention that includes cancellation means comprising phase-adjustment and amplitude-adjustment circuits at each output of the pickup means.

Another embodiment for a sustaining device of the present invention is shown in FIG. 7. The circuit in FIG. 7 includes two pickups 132 and 134, each of which include signal phase-adjustment circuits 132' and 134', respectively and signal amplitude-adjustment circuits 132" and 134", respectively. The circuit in FIG. 7 also includes a driver means 130 and an amplifier means 136. The two pickups 132 and 134, and the driver means 130 are disposed in a plane parallel to the surface of the instrument. Furthermore, the pickups 132 and 134 are placed symmetrically with respect to the driver 130, and are in close proximity to the string 18.

In practice, it is impossible to produce two coils such that their signal responses to the same magnetic flux are identical in phase and magnitude. There are inherent differences between pickups related to coil windings, axis alignment, core material, and the like which cause the induced signals in separate coils to differ. Although it is possible to produce coils that are nearly identical, typically, the coils used in a dual-coil hum-bucking pickup arrangement have significantly different values of impedance with respect to each other. While the use of pairs of pickups in a hum-bucking arrangement is effective in eliminating extraneous noise, a new problem is created, that being that the sound produced by a hum-bucking pickup assembly is not as sharp and clear as that obtainable from a single pickup. The reason for this is felt to be that the pickup coil of one of the pickups in a hum-bucking pickup assembly has a different complex impedance than the pickup coil of the other pickup in the hum-bucking assembly. Thus the relative phase of the electrical signals induced by magnetic flux in the separate pickup coils changes with respect to the frequency of those signals. This means that electrical signals in the separate pickup coils that are meant to add together will not add together exactly in phase, and signals that are meant to cancel will not add together exactly out of phase. In this case, the method of phase-matching will be useful.

The coils of pickups 132 and 134 are assumed to have signal-responses that differ from each other. The amplitude-adjustment circuits 132" and 134" and phase-adjustment circuits 132' and 134' may be applied to one or both signals such that signals induced in each coil by the driver's 130 magnetic flux may be made nearly identical such that they cancel when combined. The coils 138 and 139 of pickups 132 and 134 respectively are wound in opposite directions so that the currents induced in the pickup coils 138 and 139 by the driver's 130 magnetic flux will cancel at the input to the amplifier 136. Furthermore, the electrical signals induced in the pickups 132 and 134 by the string's 18 vibration will add together substantially in phase and thus result in a sharp clean signal output from the combined pickups 132 and 134 representing the vibration of the string 18.

The signal-response of a pickup coil is comprised of a real part and an imaginary part. The real part is related to the resistance of the coil and the imaginary part is typically dominated by the inductance of the coil at audio frequencies, thus the imaginary part is primarily proportional to the frequency of the signals. Several phase-adjustment circuits coupled with amplifiers are shown in FIG. 8. The circuits shown in FIG. 8 are examples of circuits that may be used to provide phase-compensation between two pickup signals for a broad range of signal frequencies, hence superior cancellation of the effects of external magnetic flux and elimination of circuit oscillation due to direct magnetic feedback. When using phase-compensation circuits, it is usually preferable to compensate for the phase variation between pickup coils based on the assumption that the imaginary part of each coil's complex impedance is proportional to the frequency of the pickup signal.

Figure 8A:
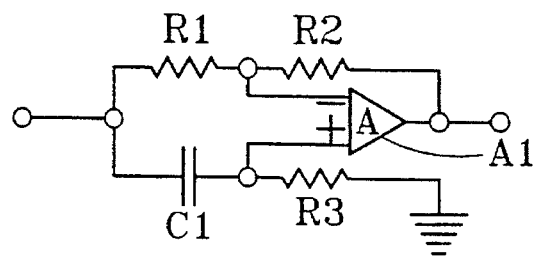
FIG. 8A is a schematic view of a circuit that may be used to adjust both phase and amplitude of a pickup signal.

FIG. 8A shows a circuit that may be used to adjust the phase and the amplitude of a pickup signal. An RC pair connected to the non-inverting input of the operational amplifier A1 shifts the phase by an amount depending on the frequency, f, of the signal. The phase shift provided by the circuit in FIG. 8A is $\phi=180°-2 \arctan(2\pi f R_3 C_1)$.

Figure 8B:
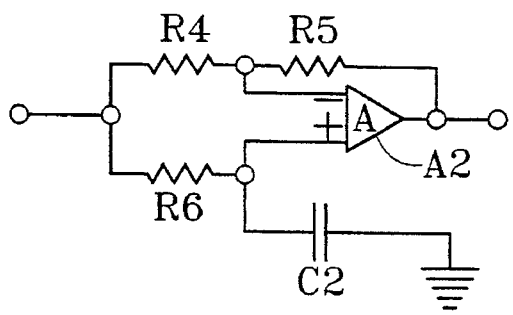
FIG. 8B is a schematic view of a circuit that may be used to adjust both phase and amplitude of a pickup signal.

FIG. 8B shows a circuit that may be used to adjust the phase and the amplitude of a pickup signal. An RC pair connected to the non-inverting input of the operational amplifier A2 shifts the phase by an amount depending on the frequency, f, of the signal. The phase shift provided by the circuit in FIG. 8B is $\phi=2 \arctan(2\pi f R_6 C_2)$.

Figure 8C:
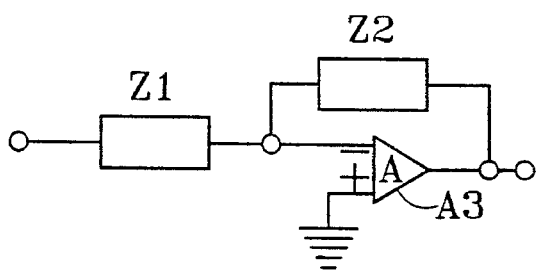
FIG. 8C is a schematic view of a circuit that may be used to adjust both phase and amplitude of a pickup signal.

FIG. 8C shows a circuit that may be used to adjust both phase and amplitude of an electrical signal. The amplifier A3 is set up as an inverting amplifier. A complex impedance Z1 precedes the inverting input of the amplifier A3. The complex impedance Z2 connects the inverting input of the amplifier A3 to the amplifier A3 output, thereby representing the numerator of the gain function for an inverting amplifier. The ratio Z1/Z2 may be constructed to provide a specific phase-shift to the amplified signal, including zero phase-shift by selecting specific circuit elements to represent the complex impedances Z1 and Z2.

Figure 8D:
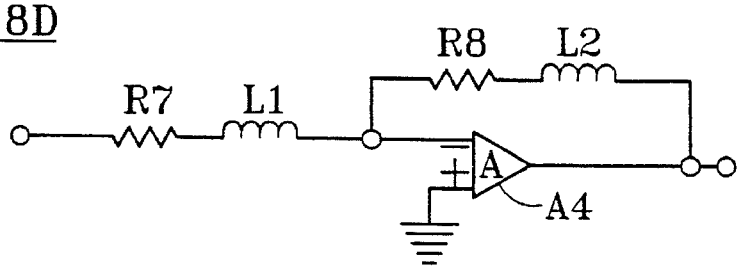
FIG. 8D is a schematic view of an amplifier whose output can be made phase-invariant with respect to frequency.

FIG. 8D shows a specific example using the circuit shown in FIG. 8C to create a phase-invariant amplifier. The complex input impedance preceding the inverting input of the amplifier A4 shows a resistor R7 and an inductor L1 connected in series. The resistor R7 and inductor L1 may represent the inductance and resistance of a pickup coil (not shown) that is connected to the inverting input of the amplifier A4, or may represent actual electrical components to be added in series with a pickup coil (not shown). The feedback loop of the amplifier A4 comprise a resistor R8 and an inductor L2. In this case the values of resistor R8 and inductor L2 are chosen such that the ratio $(R8+i2\pi f L2)/(R7+i2\pi f L1)$ is a real number for all signal frequencies, f. Thus there is no phase-shift provided to the output signal of the amplifier A4. Furthermore, the value of series resistance R7 may comprise mostly of a large additive resistance to the pickup coil (not shown) in order to reduce the relative contribution of the frequency-dependent imaginary terms to the effective complex impedance at the input to the amplifier A4.

Figure 8E:
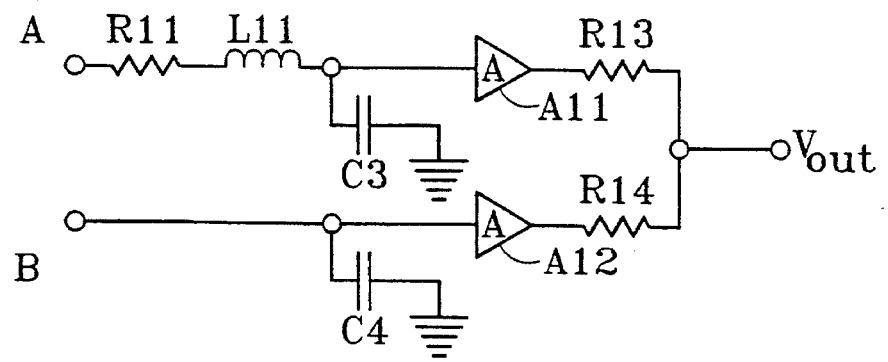
FIG. 8E is a schematic view of a circuit that may be used to adjust the phase of one of two pickup signals and the amplitude of one or both pickup signals.

FIG. 8E shows a cancellation circuit comprising a phase-adjustment circuit and an amplitude-adjustment circuit. Terminal A is connected to an output lead of a magnetic pickup, such as pickup 132, for providing a first pickup signal responsive to external magnetic flux. Terminal B is connected to an output lead of another magnetic pickup, such as pickup 134 for providing a second pickup signal responsive to external magnetic flux. The phase-adjustment circuit comprises a resistor R11 and an inductor L11 connected in series with terminal A, which is connected to pickup 132. Capacitors C3 and C4 are commonly used at the inputs to amplifiers in audio circuits to filter out radio-frequency noise from electrical signals, and when used along with the phase circuit shown, it is preferable that the values of capacitors C3 and C4 are substantially identical.

By adjusting resistor R1, the real part of the complex-valued signal-response of the pickup 132 is adjusted so that the phase of the signal-response of pickup 132 substantially matches or is substantially 180 degrees out of phase to the signal response of the other pickup 134. Likewise, the inductor L11 could be variable, and its adjustment by itself, or along with the resistor R11 could be performed to match the ratio of the real part of the complex impedance to the imaginary part of the complex impedance at the input to the amplifier A11 with the the ratio of the real part of the complex impedance to the imaginary part of the complex impedance at the input to the amplifier A12. Thus this phase-adjustment circuit provides an effective method of matching (0 degrees) or anti-matching (180 degrees) the phases of the pickup signals from pickups 132 and 134 for a broad range of audio frequencies. Likewise, an additional resistor (not shown) may be added in series with terminal B for the purpose of adjusting the phase of the input signal to amplifier A12.

The amplifiers A11 and A12 provide amplitude-adjustment to one or both pickup signals of pickups 132 and 134. The amplitude of one or both pickup signals is adjusted to make the amplitudes substantially equal so that when the first pickup signal is combined with the second pickup signal, the signals will substantially cancel. The amplifiers A11 and A12 are both inverting or non-inverting amplifiers if the first pickup signal is made 180 degrees out of phase to the second pickup signal. If the first pickup signal is in-phase with the second pickup signal, then one amplifier needs to be an inverting amplifier and the other amplifier needs to be non-inverting. The phase-adjusted, amplitude-adjusted pickup signals are combined at a typical voltage divider comprising resistors R13 and R14.

Figure 8F:
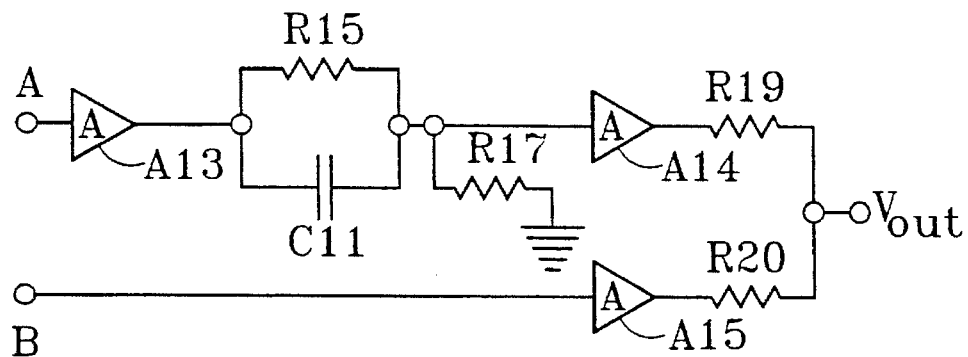
FIG. 8F is a schematic view of a circuit that may be used to adjust the phase of one of two pickup signals and the amplitude of one or both pickup signals.

FIG. 8F shows a cancellation circuit comprising a phase-adjustment circuit and an amplitude-adjustment circuit. Terminal A is connected to an output lead of a magnetic pickup, such as pickup 132, for producing a first pickup signal responsive to external magnetic flux. Terminal B is connected to an output lead of another magnetic pickup, such as pickup 134, for producing a second pickup signal responsive to external magnetic flux. The phase-adjustment circuit comprises a typical buffer amplifier A13 to prevent the addition of imaginary terms having higher than first-order dependence on signal frequency to the complex signal-response of the pickup 132. The resistors R15 and R17 and capacitor C11 provides a decrement to the imaginary part of the signal-response of the pickup 132 that is linear with respect to signal frequency. Thus the phase-adjustment circuit reduces the phase-angle at which the current lags the voltage.

The amplitude-adjustment circuit comprises amplifiers A14 and A15. Likewise, amplifier A13 may be used for amplitude-adjustment. The amplifiers A14 and A15 are both inverting or non-inverting amplifiers if the first pickup signal is 180 degrees out of phase to the second pickup signal at the inputs to the amplifiers A14 and A15, respectively. Otherwise, one amplifier needs to be inverting and the other amplifier needs to be non-inverting. The output signals from the amplifiers A14 and A15 are combined at a voltage divider comprising resistors R19 and R20 such that the contributions of external magnetic flux to the pickup signals substantially cancels.

Figure 8G:
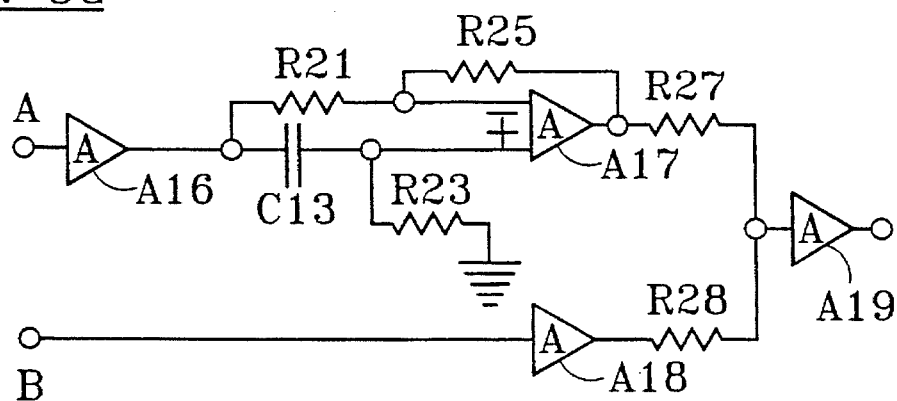
FIG. 8G is a schematic view of a circuit that may be used to adjust the phase of one of two pickup signals and the amplitude of one or both pickup signals.

FIG. 8G shows a cancellation circuit for providing phase-adjustment and amplitude-adjustment to one of two pickup signals. The terminal A is connected to the output lead of a pickup for providing a first pickup signal responsive to external magnetic flux. Terminal B is connected to the output lead of another pickup for providing a second pickup signal responsive to external magnetic flux. The amplifier A16 receives the first pickup signal and may provide amplitude-adjustment to the signal. Amplifier A16 also acts as a buffer between the pickup element and the phase-adjustment circuit. The amplifier A17 is part of an all-pass filter which provides both phase and amplitude-adjustment of the first pickup signal. The value of resistor R23 may be adjusted to change the phase of the first pickup signal according to the relation: $\phi=180°-2 \text{Arctan} (2\pi f R_{23} C_{13})$ where f is the signal frequency. The resistor R25 may be adjusted for adjusting the gain of the amplifier A17. Furthermore, amplifier A18 may be used to adjust the amplitude of the second pickup signal. The resistors R27 and R28 form a typical voltage divider for combining the output signals from amplifiers A17 and A18 so that the responses of the pickups connected to terminals A and B to external magnetic flux substantially cancel. It will be appreciated that the resistors R27 and R28 may be components of a typical summing amplifier such as amplifier A19.

Figure 8H:
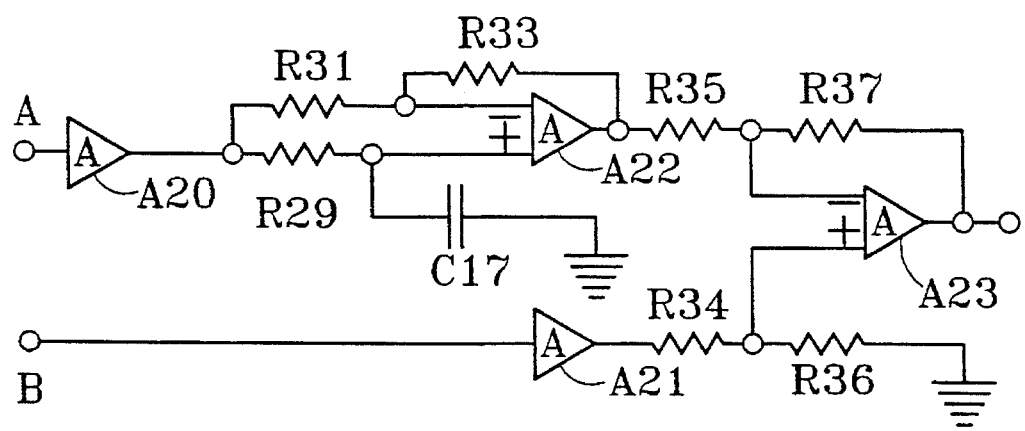
FIG. 8H is a schematic view of a circuit that may be used to adjust the phase of one of two pickup signals and the amplitude of one or both pickup signals.

FIG. 8H shows a cancellation circuit that adjusts the relative phase and magnitudes of two pickup signals to cancel the contributions of external magnetic flux to the pickup signals. Terminal A is connected to the output lead of a pickup for providing a first pickup signal responsive to external magnetic flux. Terminal B is connected to the output lead of another pickup for providing a second pickup signal responsive to external magnetic flux. Amplifiers A20 and A21 receive pickup signals from terminals A and B. Either or both amplifiers A20 or A21 may adjust the amplitude of the pickup signals. The amplifier A22 receives the output from amplifier A20 and provides the capabilities of both phase-adjustment and amplitude-adjustment. The resistor R29 may be adjusted for providing phase-adjustments to the first pickup signal according to the relation: $\phi=2 \text{Arctan} (2\pi f R_{29} C_{17})$, where f is signal frequency. The resistor R33 may be used for adjusting the amplitude of the first pickup signal. The amplifiers A21 and A22 are oriented as inverting or non-inverting amplifiers depending on which orientation provides two output signals whose contributions to external magnetic flux are in-phase. The signal outputs of the amplifiers A21 and A22 may be combined at a typical differential amplifier, such as amplifier A23, which will cancel in-phase signals and constructively add signals that are 180 degrees out of phase.

Although the assumption that the imaginary part of the pickup signal is proportional to the signal frequency is a first-order approximation that is very accurate for most pickup coils at audio frequencies, it is sometimes practical to compensate for higher-order terms resulting from the capacitance of the coil. Circuit elements may be added to the circuits of FIG. 8 in order to provide a more accurate phase-compensation circuit. Furthermore, one or both pickups may include two or more phase-adjustment circuits, and may include any combination of different phase-adjustment circuits.

A large value of resistance may be coupled in series with a pickup coil in order to make the real part of the resulting effective complex impedance of the coil very large with respect to the imaginary part at low frequencies, thus reducing the variation of the coil's effective impedance with respect to frequency. However, as larger values of resistance are employed, more noise is introduced into the signal. Furthermore, large series resistance added to each of two pickups does not always result in improved cancellation of magnetic induction noise between two pickups, but rather necessitates the application of even larger values of adjustment resistance in order to match the phase-response of both pickups according to the method shown in FIG. 8A. The benefits resulting from amplitude-matching and phase-matching the pickup signals of symmetrically equidistant pickups, such as pickups 132 and 134, include reduced magnetic interference between the pickups 132 and 134, and the driver 130, reduced noise from other sources which produce substantially uniform magnetic fields, and improved signal clarity. Using these methods of canceling external magnetic flux for the circuit shown in FIG. 7 we were able to obtain better than 99.98 percent cancellation of the effect of the driver's 130 magnetic flux on the pickups 132 and 134 throughout the entire audio range. This allowed us to position the pickups 132 and 134 as close as was physically possible to the driver 130 without magnetic interaction between the pickups 132 and 134, and the driver 130 affecting the operation of the sustaining device.

Figure 9:
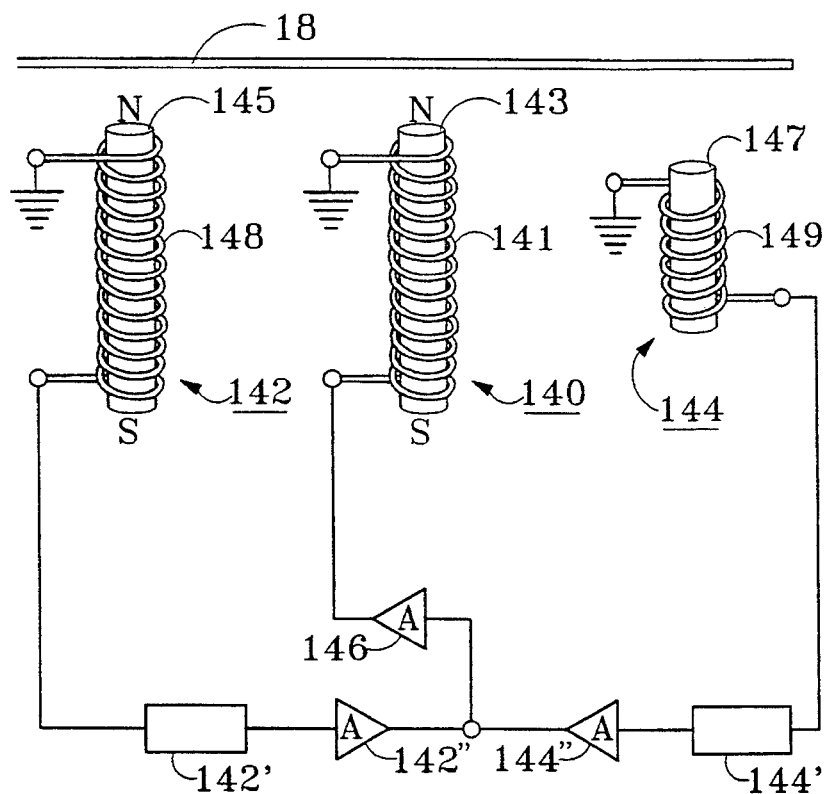
FIG. 9 is a schematic view of a preferred embodiment of the present invention that includes a cancellation means comprising phase-adjustment and amplitude-adjustment circuits.

Another embodiment of the present invention is the circuit shown in FIG. 9. the circuit shown in FIG. 9 includes a pickup means that includes two pickups 142 and 144, and a driver means 140 disposed symmetrically in a plane parallel to the surface of the instrument. An amplifier means 146 is coupled between the pickups 142 and 144, and the driver means 140. The centers of pickup 142 and 144 are placed symmetrically with respect to driver 140. One pickup 142 includes a pickup coil 148 wrapped around a magnetized core 145. The other pickup 144 includes a pickup coil 149 wrapped in the opposite direction around a non magnetized core 147. The core 147 has a shorter length than core 145 of pickup 142, but may or may not have the same diameter as core 145 of pickup 142. Because the core 147 is non magnetized, it does not need to be in close proximity to the string 18. Thus pickup 144 may be positioned below the surface of the instrument. The electrical signals induced by magnetic flux in one or both pickup coils 148 and 149 may be adjusted in magnitude and phase such that the contributions to those signals by the magnetic flux of the driver 140 will cancel. The first and second pickup coils 148 and 149 are connected to a cancellation means such as the cancellation circuits shown in FIG. 8 including phase-adjustment circuits 142' and 144', respectively, and amplitude-adjustment circuits 142" and 144", respectively.

Figure 10:
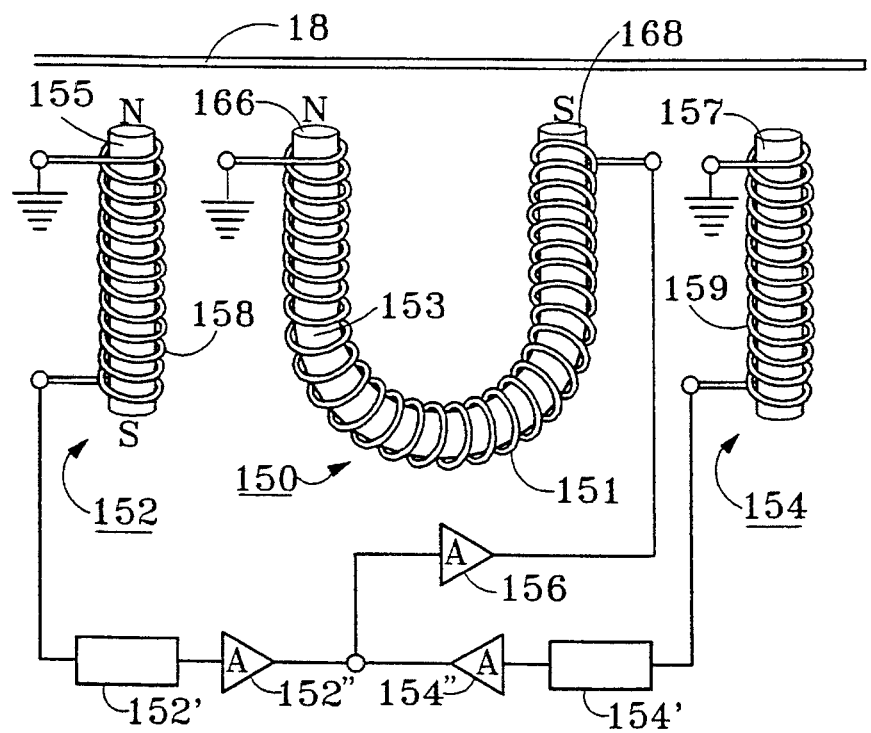
FIG. 10 is a schematic view of a preferred embodiment of the present invention that includes a driver in accordance with the driver design illustrated in FIG. 4, and a cancellation means comprising phase-adjustment and amplitude-adjustment circuits for reducing the amount of direct magnetic feedback.

Another embodiment for a sustaining device of the present invention is shown in FIG. 10 as including two pickups 152 and 154, a driver 150, and an amplifier 156 interposed in the circuit between the pickups 152 and 154, and the driver 150. Either or both pickups 152 and 154 may include phase-adjustment and amplitude-adjustment circuits, such as phase-adjustment circuits 152' and 154', respectively, and amplitude-adjustment circuits 152" and 154" respectively. The pickup 152 includes a pickup coil 158 wrapped around a magnetic core 155. The pickup 154 includes a pickup coil 159 wrapped in the same direction around a core 157 that may or may not be magnetic. The pickups 152 and 154 may be positioned symmetrically with respect to the driver 150. The driver 150 includes a section of toroidal solenoid 151 wrapped around a magnetized core 153 whose endpoles 166 and 168 are both within close proximity to the string 18. Magnetic core 153 in this case is U-shaped. However it will be appreciated that the magnetic core 153 may be a section of a circle, an ellipse, or any such closed loop.

The method of canceling external magnetic flux is demonstrated using the U-shaped driver 150 in FIG. 10 because although the reduction and confinement of the magnetic field accorded by the design of a U-shaped driver reduces the effects of magnetic field interaction in the sustaining device, further reduction of the magnetic field interaction is necessary if the pickups 152 and 154 are to be placed in close proximity to the driver 150. It will be appreciated that the cancellation method may be used with other drivers, such as the prior art driver 70 shown in FIG. 5A the driver 90 shown in FIG. 5B. Furthermore, it will be appreciated that the pickups 152 and 154 may be replaced by pickups whose response to the driver's 150 magnetic field is already reduced, such as hum-bucking pickups or pickups whose axes are perpendicular to the axis of the driver or have otherwise been rotated a specified angle to minimize direct magnetic feedback.

Figure 11:
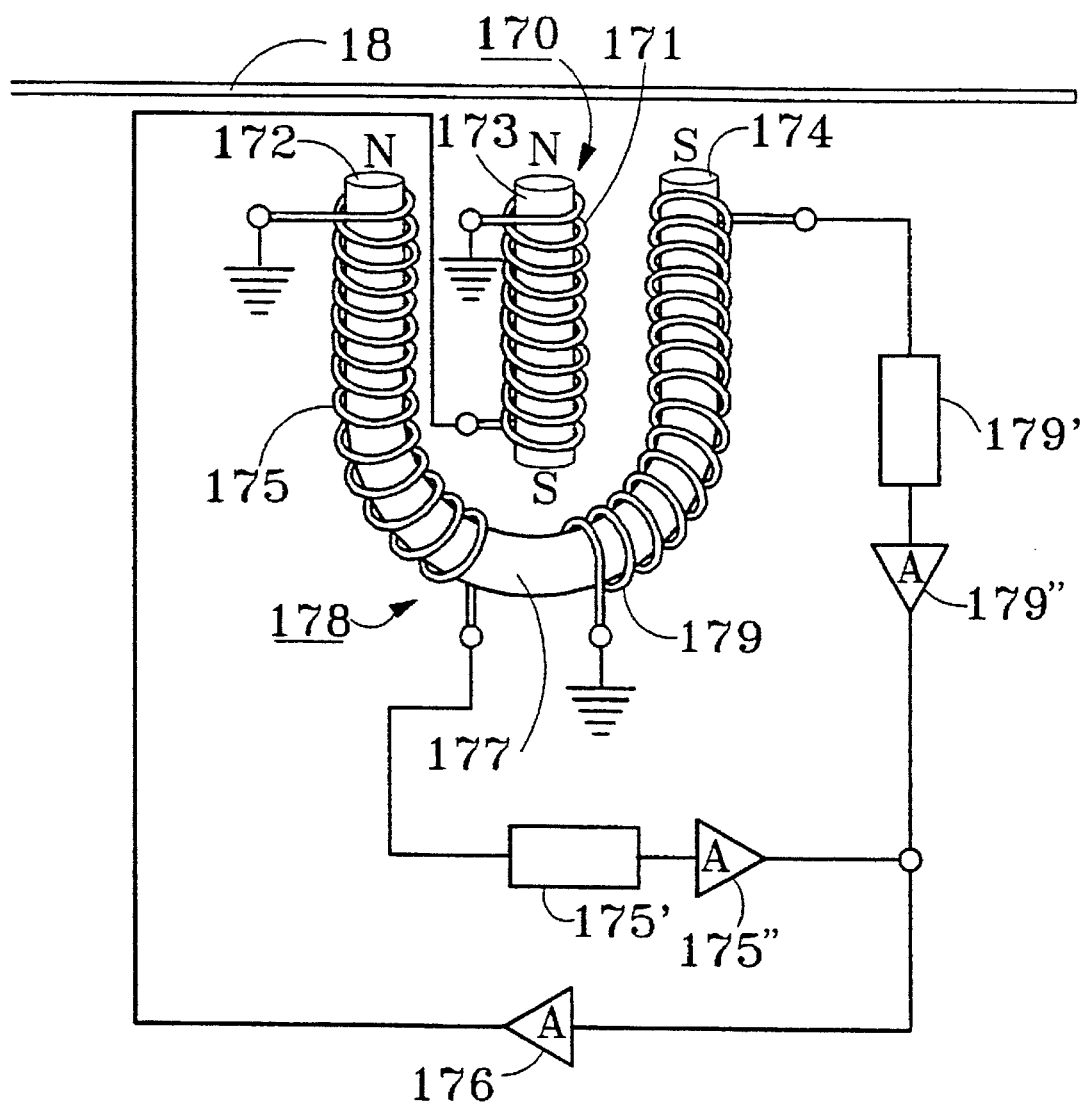
FIG. 11 is a schematic view of a preferred embodiment of the present invention that includes a pickup in accordance with the design of the driver in FIG. 3, and includes a cancellation means comprising phase-adjustment and amplitude-adjustment circuits

The circuit in FIG. 11 shows an embodiment of the present invention as including a pickup 178, a driver 170, and an amplifier 176. The driver 170 includes a driver coil 171 wrapped around a section of magnetic core 173. The amplifier 176 is interposed in the circuit between the pickup 178 and the driver 170. The pickup 178 includes a first section of toroidal solenoid 179 wound around magnetized core 177 and a second piece of toroidal solenoid 175 wound around core 177 in the same direction as the windings of the first coil 179. The core 177 includes pole pieces 172 and 174 that are both within close proximity to the string 18. The magnetic core 177 is a section of closed loop, in this case it is U-shaped. However, it will be appreciated that the core could be a section of an oval, an ellipse, or any such closed loop. Either or both coils 175 and 179 may include phase-adjustment circuits, such as phase-adjustment circuits 175' and 179', respectively, and amplitude-adjustment circuits such as amplitude-adjustment circuits 175" and 179", respectively.

The driver 170 is positioned equidistant to the pole pieces 172 and 174 of the pickup 178 so that each pole piece 172 and 174 receives the same amount of magnetic flux from the driver 170. The motion of the string 18 will induce variations in magnetic flux at pole 172 which are opposite to the variations in magnetic flux at pole 174. The electrical impulses in the pickup coils 175 and 179 due to these flux variations at the poles will be additive because the portions of wire of coil 179 on one side of core 177 are inherently reversed in direction from the portions of wire of coil 175 on the other side of the core 177. Likewise, the magnetic flux generated by the driver 170 will cancel in the pickup 178. The driver 170 shown may be replaced by another driver, such as the prior art driver 70 of FIG. 5A or the driver 90 of FIG. 5B. If the driver 170 is replaced by the driver 50 of FIG. 3 the direction of the pickup coil 179 windings on one arm of the pickup core 177 must be in the opposite direction as the pickup coil 175 windings on the other arm of the pickup core 177 in order for the responses of the pickup 178 to the magnetic flux generated by the driver 50 to substantially cancel.

Figure 12:
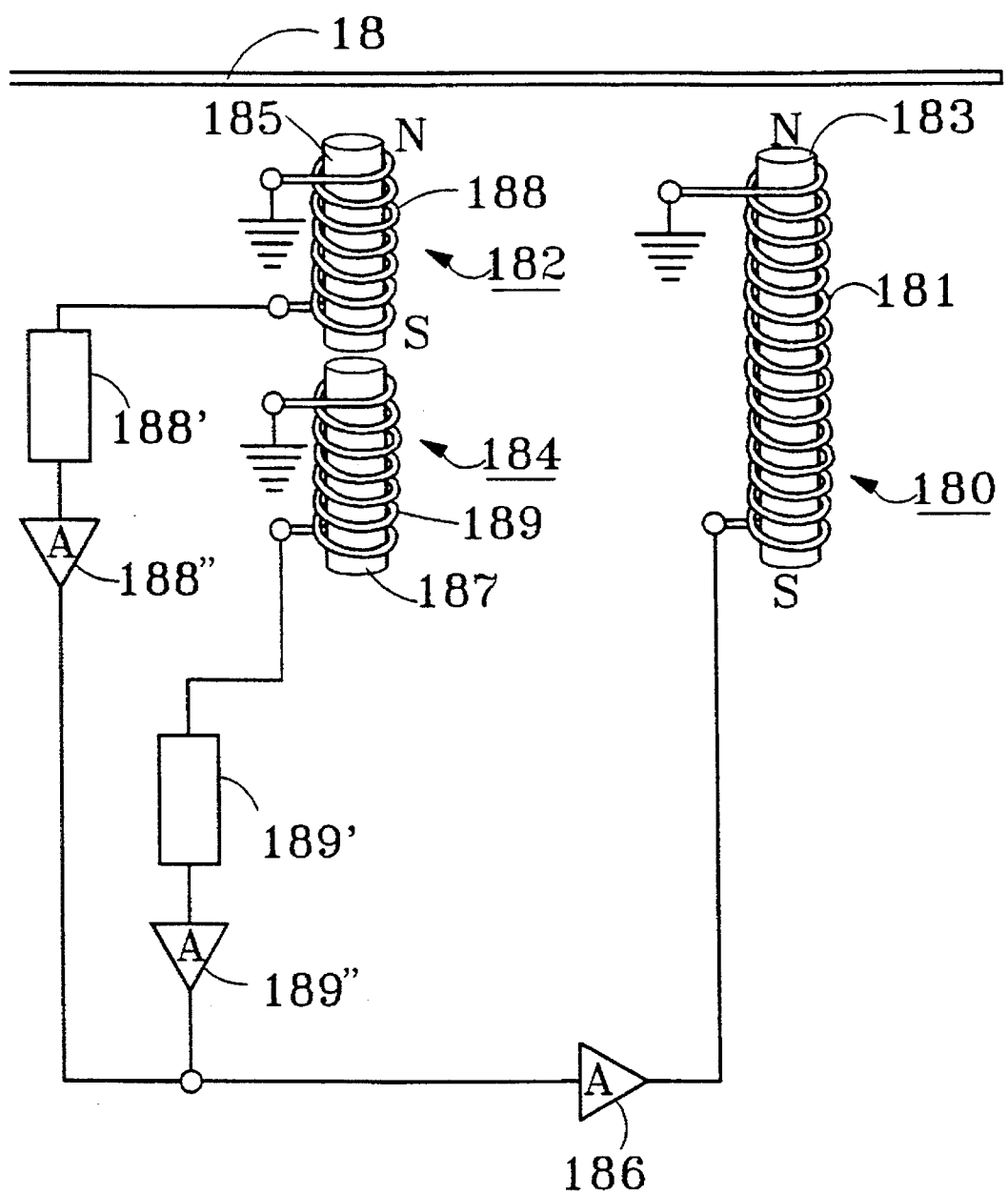
FIG. 12 is a schematic view of a preferred embodiment of the present invention that illustrates a cancellation means comprising phase-adjustment and amplitude-adjustment circuits for a pickup means in which one pickup assembly is stacked on top of another pickup assembly.

Another embodiment for a sustaining device of the present invention is shown in FIG. 12. The circuit in FIG. 12 includes a driver means 180, an amplifier means 186, and two pickups 182 and 184. The amplifier means 186 is interposed in the circuit between the two pickups 182 and 184, and the driver means 180. The two pickups 182 and 184 are disposed symmetrically with respect to the plane that bisects the height dimension of the driver 180. The center lines of the pickups 182 and 184 are collinear, hence equidistant to the center line of the driver 180. The first pickup 182 includes a pickup coil 188 wrapped around a ferromagnetic core 185 a predetermined number of turns N. One endpole of the core 185 of pickup 182 is in close proximity to the string 18 so as to sense its vibration. The pickup coil 188 of the first pickup 182 is connected in series to a phase-adjustment circuit 188'. The phase-adjustment circuit is connected to an amplitude-adjustment circuit 188". The second pickup 184 includes a pickup coil 189 wrapped in the opposite direction the same number of turns N around a ferromagnetic core 187 which may or may not be magnetized. The pickup coil 189 of the second pickup 184 is connected in series to a phase-adjustment circuit 189'. The phase adjustment circuit 189' is connected to an amplitude-adjustment circuit 189". The phase-adjusted, amplitude-adjusted pickup signals from the pickups 182 and 184 are combined so that the contributions of the driver's 180 generated external magnetic flux to the pickup signals substantially cancels. It will be appreciated that the phase-adjustment circuits 188' and 189' and amplitude-adjustment circuits 188" and 189" need only be used for one of the pickups 182 and 184. Furthermore, it will be appreciated that the amplitude-adjustment circuit 188" or 189" may precede the phase-adjustment circuit 188' or 189', or one of the pickups, such as pickup 182 may be connected to a phase-adjustment circuit and the other pickup, such as pickup 184 may be connected to an amplitude-adjustment circuit.

In this case the core 187 of pickup 184 is not directly magnetized, thus the string's 18 vibrations will not induce a signal in the pickup coil 189 except for the very small signals induced by variations in the other pickup's 182 stray magnetic field that is present in the core 187 of the pickup 184. However, magnetic shielding could be used between the two cores 185 and 187 to minimize this effect. Because the pickup 184 is not used to sense the string's 18 vibrations in this case, the pickup 184 may be replaced by a tape head or any other such transducer that is sensitive to magnetic flux. In another variant of this design, the core 187 may be magnetized to the opposite polarity as the other core 185.

Advantages provided by the embodiment of the present invention shown in FIG. 12 result from the design of the pickup means. The pickups 182 and 184 provide a hum-bucking pickup that is insensitive to non-uniform magnetic flux produced by any number of drivers of a sustain system mounted on the instrument and uniform magnetic flux produced by other electrical sources. Another advantage of this hum-bucking pickup is that it occupies only as much surface of the instrument as a single-coil pickup, thus it can be placed very close to its associated driver 180 to provide a very compact sustaining device. Furthermore, because this hum-bucking pickup may be placed anywhere in the plane which bisects the height of the driver 180, as explained above, without being sensitive to the driver's 180 magnetic flux, a hum-bucking pickup of this design may be used separately and independent of the operation of the driver 180.

Figure 13:
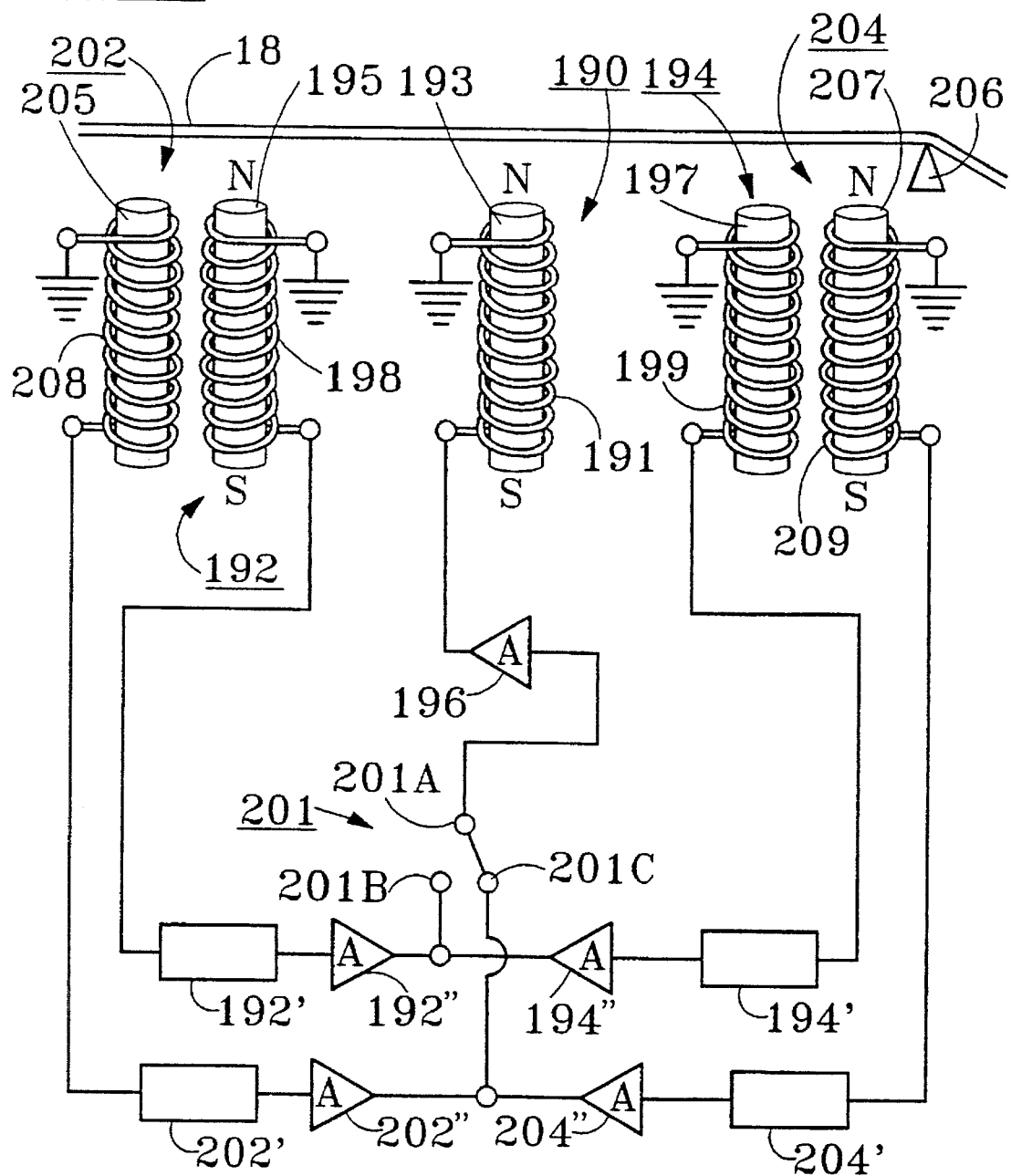
FIG. 13 is a schematic view of a preferred embodiment of the present invention that includes two pairs of pickup assemblies, a cancellation means for each pair of pickup assemblies comprising phase-adjustment and amplitude-adjustment circuits, and a means for switching between the two pairs of pickup assemblies.

Another embodiment for a sustaining device of the present invention is shown in FIG. 13. The circuit in FIG. 13 includes a driver 190, a switch 201, and an amplifier means 196 that is coupled between the driver 190 and terminal 201A of switch 2011. The driver 190 includes a driver coil 191 wrapped around a magnetic core 193. The circuit in FIG. 13 also includes a first pickup means that includes two pickups 192 and 194, and a second pickup means that includes two pickups 202 and 204. Pickup 192 includes a pickup coil 198 wrapped around a magnetic core 195 a predetermined number of turns, N. Pickup 194 includes a pickup coil 199 wrapped in the opposite direction the same number of turns, N, around a non magnetic core 197. Either or both pickups 192 and 194 may include phase-adjustment circuits, such as phase-adjustment circuits 192' and 194', respectively, and amplitude-adjustment circuits such as amplitude-adjustment circuits 192" and 194", respectively. The pickups 192 and 194 are connected in parallel and connected to terminal 201B of switch 201.

Pickup 202 includes a pickup coil 208 wrapped around a magnetic core 205 a predetermined number of turns, N'. Pickup 204 includes a pickup coil 209 wrapped in the opposite direction the same number of turns, N', around a non magnetic core 207. Either or both pickups 202 and 204 may include phase-adjustment circuits, such as phase-adjustment circuits 202' and 204', respectively, and amplitude-adjustment circuits such as amplitude-adjustment circuits 202" and 204", respectively. The pickups 202 and 204 are connected in parallel and connected to terminal 201C of switch 201. Pickups 192 and 194 are placed symmetrically equidistant with respect to the driver 190 and in close proximity to the string 18. Pickups 202 and 204 are placed symmetrically equidistant with respect to the driver 190 and in close proximity to the string 18, thus pickups 194 and 204 are positioned close to the bridge 206, and pickups 192 and 202 are positioned farther away from the bridge 206.

Pickups 192 and 204 are sensitive to the vibration of the string 18 and to the magnetic flux generated by the driver 190, whereas pickups 194 and 202 are sensitive to the magnetic flux generated by the driver 190, but not to the vibration of the string 18. The bridge 206 of the instrument serves as a node for the fundamental and all subsequent harmonics of the string 18. The pickup 204 is positioned such that it senses the string's 18 motion at a point close to the bridge 206. Thus the signal from the pickup 204 will emphasize the higher harmonics because the fundamental will be sensed relatively near to its node while the higher harmonics will be sensed closer to their anti nodes. When the gate of switch 201 connects terminals 201A to 201C, the sustaining device will favor the higher harmonics. Furthermore, the polarity of the magnetic core 207 of the pickup 204 may be reversed from the polarity as shown in FIG. 13, or some other means of phase-shifting may be employed before terminal 201C of switch 201 such that the fundamental frequency of the pickup signal is made substantially out of phase to the drive signal. Thus the sustaining device will further favor the vibration of the string's 18 higher harmonics. Pickup 192 is positioned at a point that is not close to the bridge 206, therefore the resulting signal from the pickup 192 will emphasize the fundamental frequency of the string 18. When the gate of switch 201 connects the terminals 201A to 201B, the sustaining device will favor the fundamental frequency.

Figure 14:
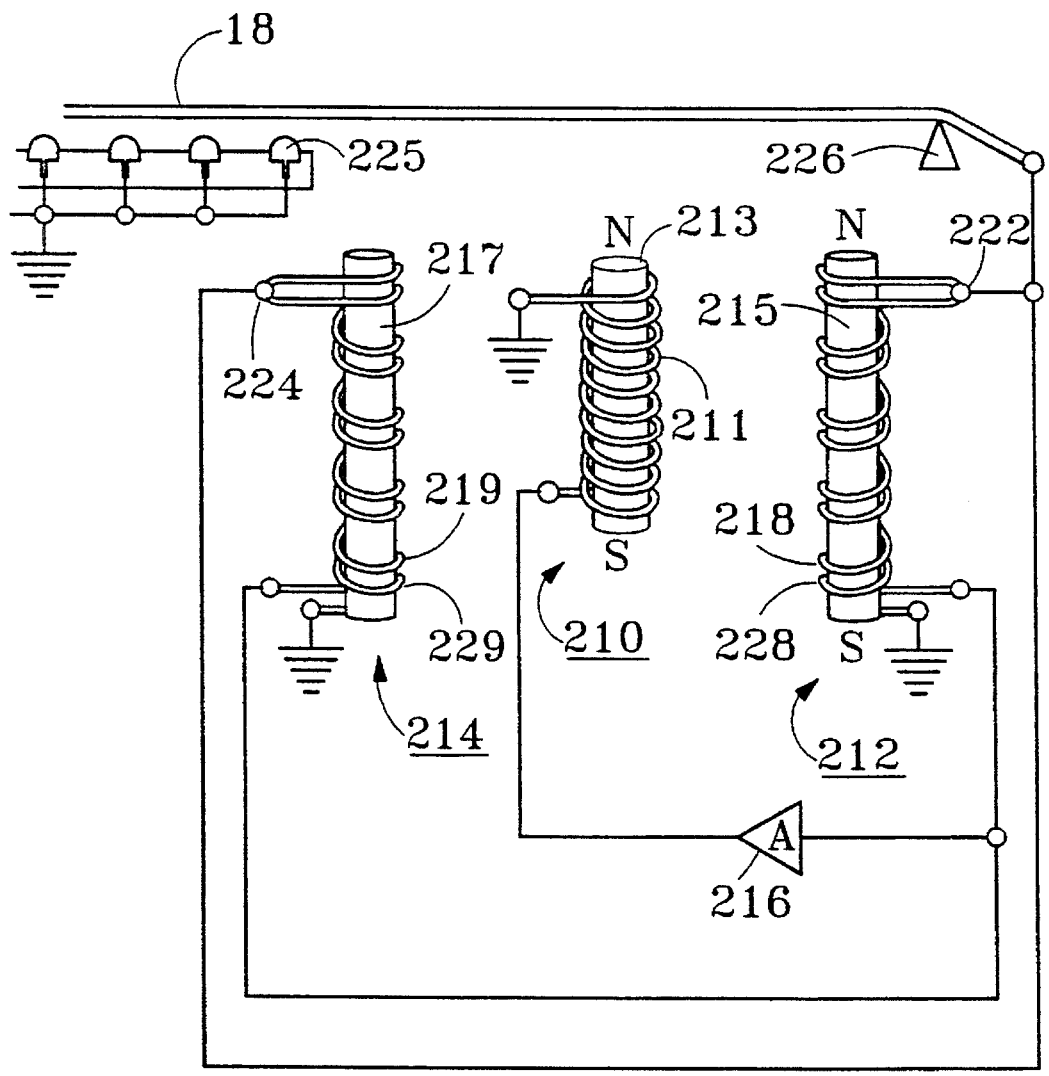
FIG. 14 is a schematic view of a preferred embodiment of the present invention that demonstrates an application of cancellation which results in the pickup means producing no significant signal except when the string is touching a fret.

Another embodiment for a sustaining device of the present invention as shown in FIG. 14 includes a drive means 210, an amplifier means 216, and a pickup means that includes two pickups 212 and 214. The driver 210 includes a driver coil 211 wrapped around a magnetic core 213. The amplifier 216 is coupled between the pickups 212 and 214 and the driver means 210. The pickup 212 includes a first pickup coil 218 wrapped a predetermined number of turns N around a magnetic core 215 and a second pickup coil 228 wrapped in the opposite direction the same number of turns N around the magnetic core 215. The pickup 214 includes a first pickup coil 219 wrapped a predetermined number of turns N around a non magnetic core 217 and a second pickup coil 229 wrapped in the opposite direction the same number of turns N around the magnetic core 217. It will be appreciated that core 217 may be a magnetic core whose polarity is opposite to the polarity of the magnetic core 215. Pickup coil 218 and pickup coil 219 are connected in parallel at the amplifier 216. Pickup coil 218 and pickup coil 228 are connected in series at node 222. Pickup coil 219 and pickup coil 229 are connected in series at node 114. Node 222 is connected to node 224. A resistor (not shown) may be used to connect node 222 to node 224 so that one pickup does not act as a load on the other pickup. Node 222 is also connected to the string 18. The string 18 is electrically isolated from any other strings of the instrument, and it is electrically isolated from ground except when it is in contact with one of the grounded frets of the fretboard 225.

The signal induced in the pickup coil 218 by the string's 18 vibration and by the driver's 210 magnetic flux is equal in magnitude, but 180 degrees out of phase to the signal induced in pickup coil 228. Because the pickup coils 218 and 228 are connected in series, the output from the pickup 212 to the amplifier 216 is close to zero. Similarly, the signal induced in the pickup coil 219 by the driver's 210 generated magnetic flux is equal in magnitude but 180 degrees out of phase to the signal induced in the pickup coil 229. Because the pickup coils 219 and 229 are connected in series, the output signal from the pickup 214 to the amplifier 216 is almost zero. When the string 18 touches a grounded fret of the fret board 225, the signal from pickup coil 228 and the signal from pickup coil 229 are both grounded. The signal induced in the pickup coil 218 by the driver's 210 magnetic flux is equal in magnitude but opposite in phase to the signal induced in pickup coil 219, thus the signals resulting from the driver's 210 magnetic flux cancel at the input to the amplifier 216. Thus the net signal into the amplifier 216 is the response of pickup coil 218 to the vibration of the string 18.

The net output to the amplifier 216 from the pickups 212 and 214 is substantially zero except when the string 18 touches a grounded fret of the fretboard 225. The advantage of this result is that the string 18 will be sustained only when it is pressed to a grounded fret of the fretboard 225. When the string 18 is released from the grounded fret, the vibration of the string 18 is no-longer driven. Thus a musician may play the instrument without having to damp out strings that are not being played in order to prevent those strings from being excited by the sustaining device. Furthermore, if the output from the amplifier 216 is used to provide the musical output of the instrument, only the strings being played would provide a significant audible output. Thus when a string is accidentally struck, as often occurs when changing chords or bending a string, the string vibration caused by the musician's error will not be audible. Furthermore, pickups 212 and 214 may be used without the amplifier 216 and the driver 210 and thus provide a means of excluding the motion of unplayed strings from the output signal of the instrument without requiring an electrical power source, such as batteries.

Figure 15:
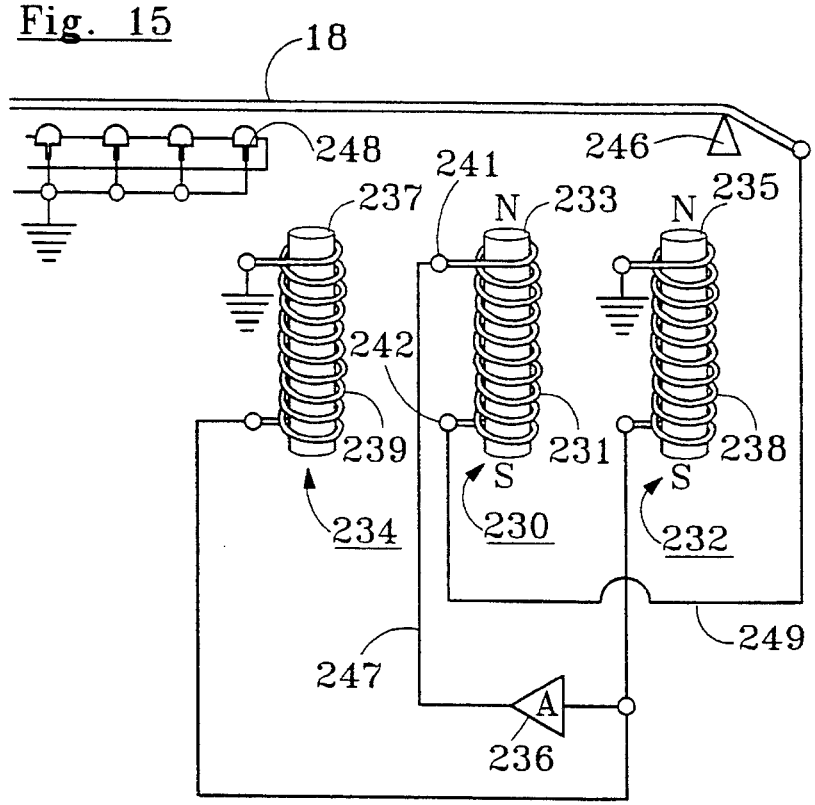
FIG. 15 is a schematic view of a preferred embodiment of the present invention that illustrates the application of the law of Biot-Savart for driving the vibrations of a string when the amplified signal to the driver is also routed through the string.

Another embodiment for a sustaining device of the present invention is shown in FIG. 15 as including two pickups 232 and 234, a driver means 230, and an amplifier means 236 connected between the pickups 232 and 234 and the magnetic driver 230. The driver 230 includes a driver coil 231 wrapped around a magnetic core 233. One end of the driver coil 231 is connected to a node 241, and the other end of the driver coil 231 is connected to node 242. The node 242 is the output of the driver 230 and is connected to the string 18 by an electrically conductive element, such as wire 249. The output of the amplifier 236 is connected to the input of the driver 230, node 241, by an electrically conductive element, such as wire 247. The string 18 is electrically conductive, and is connected to a bridge 246 of the instrument. The string 18 is also connected at the end of the fretboard 248 by a locking nut or tuner (not shown). The string 18 is preferably electrically isolated from other strings (not shown) of the instrument.

The signal from the pickups 232 and 234 are added together and amplified by the amplifier 236. When the string 18 touches a grounded fret of the fretboard 248, the output signal of the amplifier 236 flows through wire 247 to the driver coil 231 and through wire 249, then through the string 18 until it reaches the grounded fret of the fretboard 248. The driver 230 generates a magnetic flux that drives the vibration of the string 18 in a plane that is parallel to the axis of the driver coil 231. The current in the string 18 interacts with the magnetic field generated by the driver coil 231 according to the law of Biot Savart as described by the following equation; $dF=(u/4\pi) I\, dl\times(I'dl'\times r)/r^3$, where dF is the incremental force resulting from the interaction between the current I in a segment dl of the string 18 and the current I' in a segment of the driver coil 231, dl' separated by vector r. The scalar magnitude of r is r. The value of u is $1.257\times10^{-6}$ N/A$^2$. The incremental force dF acts on the string 18 in the plane that is perpendicular to the driver coil 231. The natural vibratory motion of the string 18 in the plane that is perpendicular to the length of the string 18 tends to be an ellipse. Thus it is believed that the sustaining device shown in FIG. 17 drives the string 18 more efficiently, and the tone that results is more natural because the string 18 is being driven along both the major and minor axes of the ellipse formed by one of the string's 18 natural modes of oscillation. The sustaining device shown in FIG. 15 also has the advantage that the string 18 will be driven only when the string 18 is fretted. In another variant of the present invention, the driver 230 is substituted with a driver (not shown) that generates a magnetic field that is perpendicular to the string 18 and lies in a plane parallel to the surface of the instrument. The force on the string 18 resulting from the current in the string 18 interacting with the magnetic field generated by the driver 230 is perpendicular to the surface of the instrument, thus the interaction of the current in the string 18 with the driver's 230 generated magnetic field will reinforce the driving effect of the driver's 230 generated magnetic flux acting on the ferromagnetic string 18.

The pickups 232 and 234 are already balanced with respect to the driver 230. However the pickups 232 and 234 will be sensitive to the magnetic fields generated by current in the string 18, and current in the wires 247 and 249 unless some sort of balancing or a combination of shielding and balancing is performed. One method of balancing is to position the wires 247 and 249 such that the signals induced in the pickups 232 and 234 by the magnetic field generated by the current in the wires 247 and 249 cancel the induced signal in the pickups 232 and 234 by the current in the string 18. An alternate method is to provide magnetic shielding around the wires 247 and 249, then the pickups 232 and 234 need to be balanced only with respect to the string 18. An example of how this may be performed with the sustaining device shown in FIG. 17 is to position the pickups 232 and 234 equidistant to the string 18 so that they receive the same amount of magnetic flux from the string 18. Then the signals from the pickups 232 and 234 induced by the magnetic flux generated by the string 18 are added out of phase so that they cancel.

Figure 16:
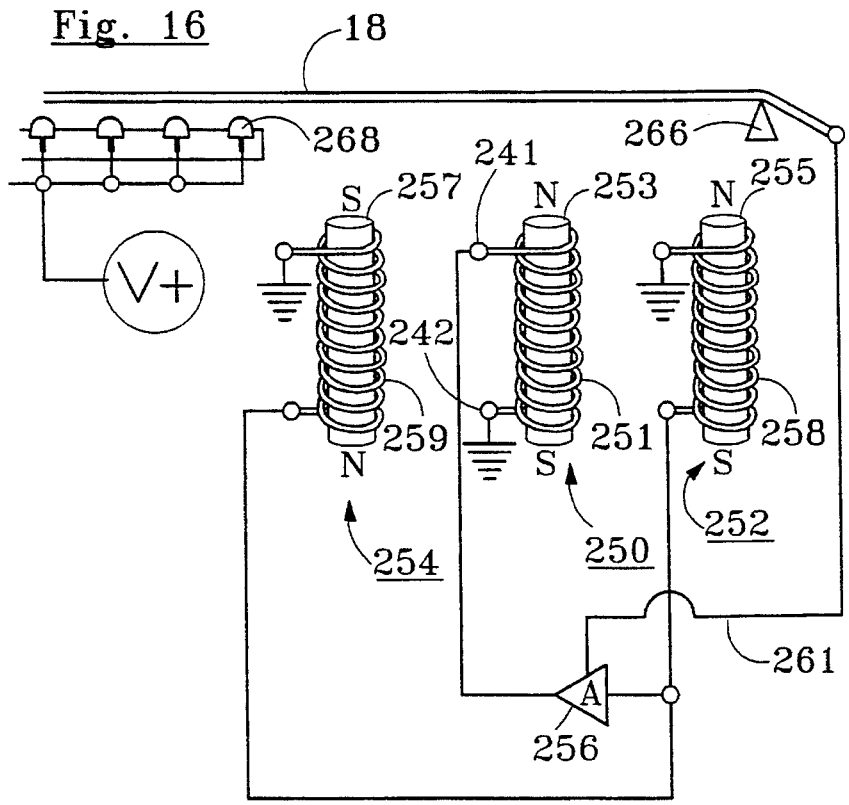
FIG. 16 is a schematic view of a preferred embodiment of the present invention that illustrates the application of the law of Biot-Savart for driving the vibrations of a string when the supply current to the amplifier means is routed through the string.

Another embodiment for a sustaining device of the present invention is shown in FIG. 16 as including two pickups 252 and 254, a driver means 250, and an amplifier means 256 connected between the two pickups 252 and 254 and the magnetic driver 250. The driver 250 includes a driver coil 251 wrapped around a magnetic core 253. The pickups 252 and 254 may include cancellation means comprising phase-adjustment circuits (not shown) and amplitude-adjustment circuits (not shown) for reducing magnetic interaction with the driver 250 such that the net signal added together from pickups 252 and 254 is insensitive to the effects of the magnetic flux generated by the driver 250. The positive power supply terminal to the amplifier 256 is connected via wire 261 to an electrically conductive string 18. One end of the string 18 is connected to a bridge 266 of the instrument and the other end of the string 18 is connected to a locking nut or tuner (not shown) at the end of the fretboard 268. The electrically conductive frets of the fretboard 268 are connected to the positive terminal of a power supply unit.

When the string 18 touches a fret of the fretboard 268, current flows through the string 18 and the amplifier 256 is supplied with power. The amplifier 256 amplifies the signal from the pickups 252 and 254 and powers the driver 250 which generates a magnetic field that drives the string's 18 oscillations in a plane parallel to the axis of the driver coil 251. The current in the string 18 interacts with the magnetic field generated by the driver 250 according to the law of Biot Savart, and results in driving the oscillations of the string 18 in a plane perpendicular to the axis of the driver 250. The pickups 252 and 254 may be balanced with respect to the string 18 as described above such that it does not become sensitive to electrical noise or surges in the current flowing through the string 18.

The circuit shown in FIG. 17 provides an alternate method for providing simultaneous sustain of multiple strings. The circuit shown in FIG. 17 includes individual drivers 270A, 270B, 270C, and 270D for each of the four strings 18A, 18B, 18C, and 18D, and two pickups 272 and 274 that bridge each of the four shown strings 18A, 18B, 18C, and 18D. Each pickup, 272 and 274 includes phase-adjustment circuits 272' and 274', and amplitude-adjustment circuits 272" and 274". It will be appreciated that phase-adjustment and amplitude-adjustment need only be applied to either one of the two pickups 272 and 274. Pickups 272 and 274 are placed symmetrically with respect to each of the drivers, 270A, 270B, 270C, and 270D. Additionally, the pickups 272 and 274 are connected to each of four adjustable level control circuits 275A, 275B, 275C and 275D. The first adjustable level control circuit 275A, is coupled between the pickups 272 and 274, and the first amplifier circuit 276A, the second adjustable level control circuit 275B is coupled between the pickups 272 and 274, and the second amplifier circuit 276B, the third adjustable level control circuit 275C is coupled between the pickups 272 and 274, and the third amplifier circuit 276C, and the fourth adjustable level control circuit 275D is coupled between the pickups 272 and 274, and the fourth amplifier circuit 276D. The amplifier circuit 276A is connected to driver 270A. The amplifier circuit 276B is connected to driver 270B. The amplifier circuit 276C is connected to driver 270C. The amplifier circuit 276D is connected to driver 270D.

Each of the four drivers, 270A, 270B, 270C, and 270D are located equidistant from pickups 272 and 274, and are configured so that the drivers may act individually on separate strings 18A, 18B, 18C, and 18D. Each individual driver, 270A, 270B, 270C, and 270D may include one or more driver coils, and each of the pickups 272 and 274 may include one or more pickup coils.

Each adjustable level control circuit 275A, 275B, 275C, and 275D provides a uniform-amplitude output for each input signal such that the system gain does not change appreciably when the adjustable level control circuit's associated string is fretted in different positions. The signal amplitude of each adjustable level control circuit's output is adjusted by weighting each input during the summing process or by adjusting the gain of each adjustable level control circuit, or both such that the feedback gain for each string is equalized. The sustaining device will find no one particular string of the instrument easier to sustain than any other string of the instrument, thus it will not favor one particular string or group of strings over any other. Furthermore, any particular fret position of any string will not be favored over any other fret position of any other string. Each adjustable level control circuit 275A, 275B, 275C, and 275D may include an appropriate low-pass, band-pass, or high-pass filter so that each driver 270A, 270B, 270C, and 270D receives only those signals whose frequencies fall within the spectrum of desired frequencies of the driver's associated string. The filters help reduce the amount of magnetic damping that can occur when the drivers drive strings with signals resulting from the motion of other strings.

Figure 18A:
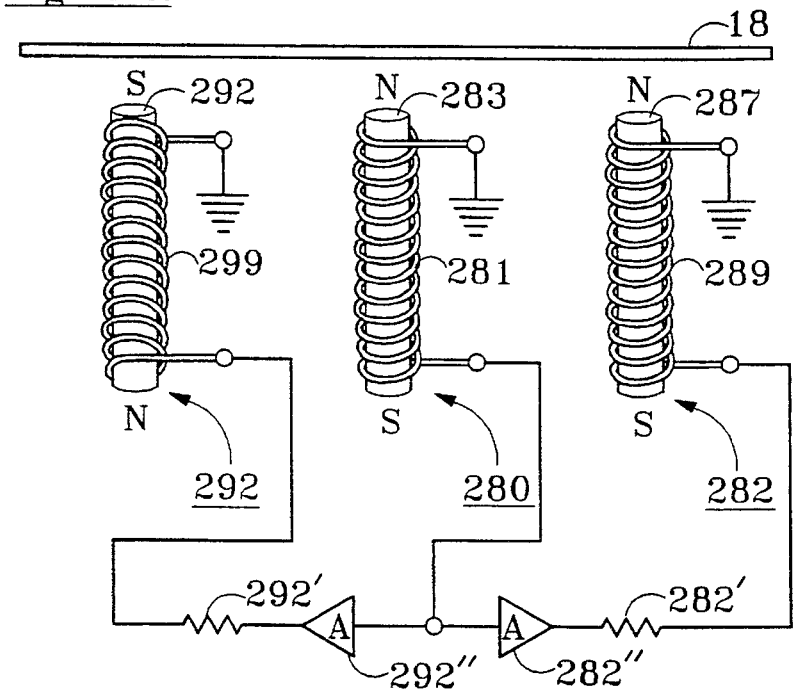
FIG. 18A is a schematic view of a preferred embodiment of the present invention that illustrates the cancellation of magnetic flux generated by two magnetic drivers.

Another embodiment for a sustaining device of the present invention is shown in FIG. 18A as including a pickup means 280, a drive means which includes two drivers 282 and 292, an amplifier means 282" that is coupled between the pickup 280 and the driver 282, and an amplifier means 292" that is coupled between the pickup 280 and the driver 292. Alternately, the drivers 282 and 292 may be driven by separate amplifiers (not shown). The pickup 280 includes a pickup coil 281 wrapped around a magnetic core 283. The pickup 280 is positioned such that it is equidistant to the drivers 282 and 292. The driver 282 includes a driver coil 289 wrapped around a magnetic core 287. The driver 292 includes a driver coil 299 wrapped in the opposite direction around a magnetized core 297 whose polarity is opposite to the polarity of the magnetized core 287. The driver coil 299 is connected to a phase-adjustment circuit 292', and the driver coil 289 is connected to a phase-adjustment circuit 282'. The phase-adjustment circuit 292' is shown as including a resistor connected in series with the driver 292. Similarly, the phase-adjustment circuit 282' is shown as including a resistor connected in series with the driver 282. However, in either or both phase-matching circuits 282' and 292' other combinations of electrical components could be used that provide an additive real number that is independent of frequency to the real part of the complex impedance of the driver coil and or an imaginary part that is a first order term with respect to frequency that may add to or subtract from the imaginary term of the complex impedance of either driver coil 282 or 292, such as an inductor added in series or a capacitor and resistor connected in parallel. Furthermore, in order to compensate for higher-order impedance terms with respect to frequency, the phase-adjustment circuits 282' and 292' may include additional electrical components, such as a capacitor connected to ground.

The resistor shown in each of the phase-adjustment circuits 282' and 292' affects the amplitude of each drive signal as well as the phase. However, the amplitude-adjustment circuits 282" and 292" affect only the amplitude of the drive signal for all practical purposes. Thus the phase can be adjusted for constant amplitudes by adjusting both phase-adjustment circuits 282' and 292' and amplitude-adjustment circuits 282" and 292" so that the amplitude changes caused by adjustments of the phase-compensation circuits 282' and 292' can be compensating for by appropriately adjusting either or both amplitude-adjustment circuits 282" and 292". Phase-adjustment circuits such as shown in FIG. 8 may precede the amplitude-adjustment circuits 282" and 292" so that the adjustment of phase does not have as significant an effect on the amplitude of the drive signals. Furthermore, the pickup means 280 may include a cancellation circuit for reducing the effects of external magnetic flux generated by the drivers 282 and 292.

Figure 18B:
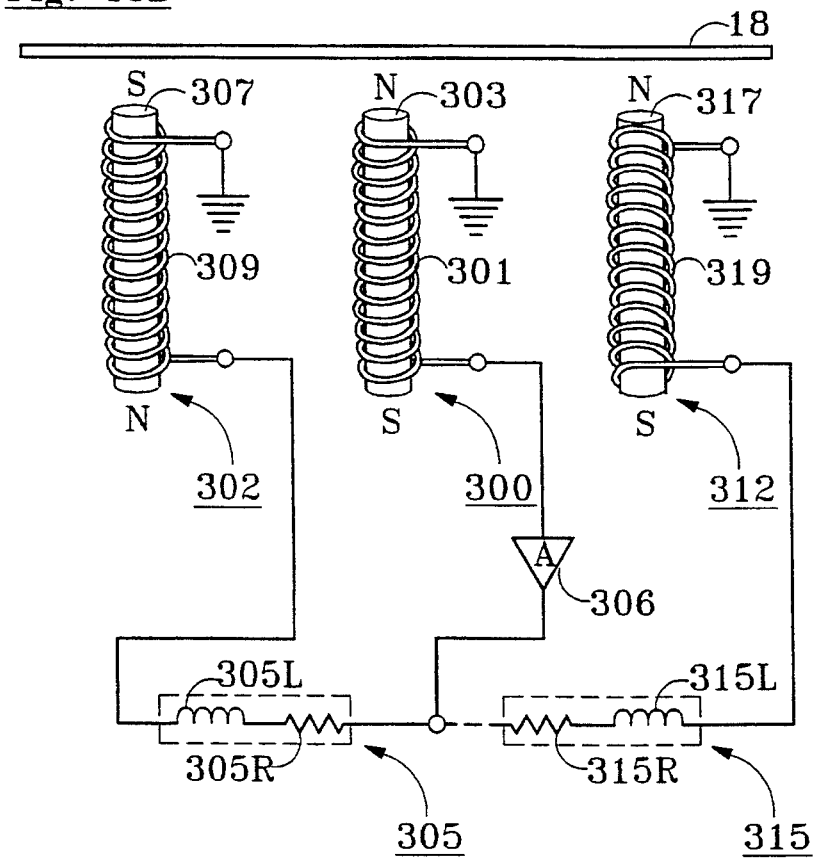
FIG. 18B is a schematic view of a preferred embodiment of the present invention that illustrates the cancellation of magnetic flux generated by two magnetic drivers.

Another embodiment for a sustaining device of the present invention is shown in FIG. 18B as including a pickup means 300, a driver means which includes two drivers 302 and 312, and an amplifier means 306 that is coupled between the pickup 300 and the drivers 302 and 312. The pickup 300 includes a pickup coil 301 wrapped around a magnetic core 303. The pickup 300 may be positioned such that it is equidistant to the drivers 302 and 312. The driver 302 includes a driver coil 309 wrapped around a magnetic core 307. The driver 312 includes a driver coil 319 wrapped in the opposite direction around a magnetized core 317 whose polarity is opposite to the polarity of the magnetized core 307. The driver coil 309 is connected to a phase and amplitude-adjustment circuit 305, and the driver coil 319 is connected to a phase and amplitude-adjustment circuit 315. The phase and amplitude-adjustment circuit 305 is shown as including an inductor 305L and a resistor 305R connected in series. Similarly, the phase and amplitude-adjustment circuit 315 is shown as including an inductor 315L and a resistor 315R connected in series. However, in either or both phase and amplitude-adjustment circuits 305 and 315 other combinations of electrical components could be used that provide an additive real number that is independent of frequency to the real part of the complex impedance of the driver coils 309 and 319, and or an imaginary part that is a first order term with respect to frequency that may add to or subtract from the imaginary term of the complex impedance of the driver coils 309 and 319, such as a capacitor and resistor connected in parallel (not shown). Furthermore, in order to compensate for higher-order impedance terms with respect to frequency, the phase and amplitude-adjustment circuits 305 and 315 may include additional electrical components, such as a capacitor connected to ground.

Changing the values of series resistance 305R and 315R and inductance 305L and 315L changes both phase and amplitude of the magnetic flux generated by the drivers 302 and 312. Thus it is useful to have at least one variable resistor and variable inductor in the circuit, however it is not necessary to have both drivers 302 and 312 serviced by phase and amplitude-adjustment circuits. Because the magnetic fields generated by the two driver coils 309 and 319 may tend to already be close in phase and amplitude, only very small variations in the effective coil resistances and or inductances may be required to match the magnitudes and phases of the magnetic flux at the pickup 300 generated by both driver coils 309 and 319. However, the demand for precise adjustment of the phase and amplitude-adjustment circuits 305 and 315 can be relaxed if the pickup 300 shown in FIG. 18B is replaced by a pickup means whose response to the magnetic flux generated by the drivers 302 and 312 are already reduced.

Figure 19:
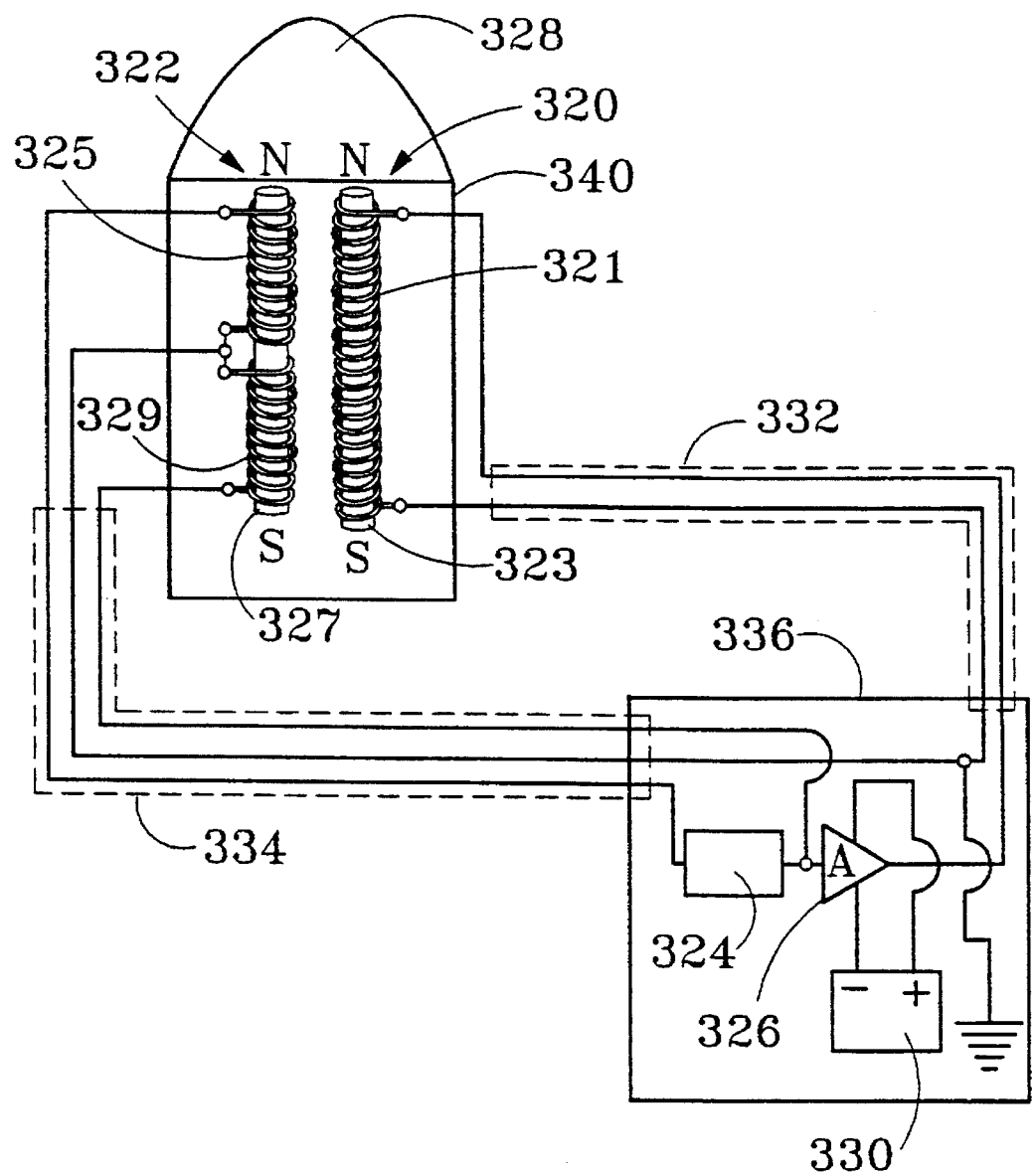
FIG. 19 is a schematic view of a preferred embodiment of the present invention that illustrates how the method of cancellation can minimize the size of a hand-held sustainer.

A preferred embodiment for a hand-held sustaining device of the present invention is shown in FIG. 19 as including a magnetic driver means 320, a pickup means 322 and an amplifier means 326 connected to a power supply shown here as a battery 330. The pickup means 322 and the driver 320 are housed in a first capsule 340 that the musician holds in close proximity to any one of the strings of the instrument, such as string 18 shown. The first capsule 340 may include a pick 328 or a means of attaching a pick (not shown) for plucking the strings of the instrument. The pickup 322 includes a pickup coil 325 wrapped around magnetic core 327 and a pickup coil 329 wrapped in the opposite direction around the core 327. The pickup coils 325 and 329 are connected to a cancellation means 324 including phase adjustment circuits (not shown) and amplitude adjustment circuits (not shown). A wire 334 connects the output of the pickup 322 to the input of the amplifier means 326. The driver means 320 includes a driver coil 321 wrapped around a magnetic core 323. A wire 332 connects the output of the amplifier means 326 to the input of the driver 320. The amplifier 326 and the battery 330 are contained within a second capsule 336 that may be attached to the musician's wrist or arm or any other such place so as not to interfere with the playing of the instrument.

The pickup coils 325 and 329 are preferably chosen or constructed so that each of their resistance and inductance are approximately equal. Pickup coil 325 produces a greater pickup signal to the string's 18 vibration than does pickup coil 329. Thus when the pickup signals are combined at the cancellation means 324 to cancel the responses of the coils 325 and 329 to external magnetic flux, the resulting signal is the response of the pickup means 322 to the vibration of the string 18. The resulting cancellation of the effects of the driver's 320 generated magnetic flux allows the pickup means 322 to be placed in contact with the driver 320. The size of the driver 320 and the pickup means 322 may be small so as to allow the width of the first capsule 340 to be smaller than the width of a standard guitar pick. A pick 328 or means for attaching a pick to the first capsule 340 may be included in the first capsule's 340 design. The endpoles of the driver 320 and pickup 322 may be positioned far enough away from the edge of the pick 328 used to pluck the strings so as to prevent the strings from being sustained during normal picking. The second capsule 336 contains bulkier components than the first capsule 340, and may be attached to the musician's wrist or one of the musician's fingers by an elastic band or a piece of Velcro or the like. Alternately, the second capsule 336 may be attached to the instrument. The battery 330 may be assisted by or replaced by another power supply that is not contained within the second capsule 340. Furthermore, the amplifier means 326 may also include an automatic level control circuit or effects processors.

The arrangement of the driver 320 and the pickup means 322 in the embodiment of the present invention shown in FIG. 19 is preferred because of the economy of space afforded by this design. However, any of the other methods of reducing the effects of magnetic field interference between the driver 320 and the pickup means 322 may be used in addition to the design shown in FIG. 19, or in place of the design of FIG. 19.

The following additional information is pertinent to all or some of the embodiments discussed above.

The pickup balancing and phase-matching methods described above are illustrated by sustain systems comprising circuits having a single driver coil. The same principles apply however, when the driver has two or more driver coils, since the pickup balancing and phase-matching methods compensate for the net magnetic field produced by the combination of the collective driver coils.

The driver balancing and phase-matching methods are illustrated above by sustain systems wherein a single coil pickup is used. However, the same principles apply when the pickup has two or more coils, since the driver balancing and phase-matching methods compensate for the net magnetic feedback voltage produced by the combination of the collective pickup coils.

The pickup balancing and phase-matching methods and the driver balancing and phase-matching methods described above may be used to reduce the effects of direct magnetic feedback radiated to other pickups on the instrument not directly related to the sustain system.

It will be appreciated that drivers and pickups illustrated in the embodiments associated with only a single string may be used with a plurality of strings, or may be associated with each string of a plurality of strings.

It will also be appreciated that although dual-coil pickup systems and dual coil driver systems are shown, the principles discussed in the embodiment will also apply when multiple coil systems (three or greater) are used. It will also be appreciated that the relative magnetic polarities shown in the embodiments discussed above may be reversed to obtain the same results as described throughout the invention.

Although the invention has been described in detail with reference to the illustrated preferred embodiments, variations and modifications exist within the scope and spirit of the invention as described and defined in the following claims.

I claim:

1. A sustaining device for prolonging the vibration of a string of a stringed musical instrument, the sustaining device comprising:

a magnetic driver means to generate external magnetic flux to drive vibrations of said string, a first magnetic pickup means responsive to external magnetic flux generated by said driver for producing a first pickup signal, a second magnetic pickup means responsive to external magnetic flux generated by said driver and responsive to magnetic flux caused by vibration of said string for producing a second pickup signal, an amplifier means for amplifying a joint pickup signal from said first and said second pickup means to produce a drive signal connected to said driver means to enable said driver means to generate said external magnetic flux for sustaining vibrations of said string, an amplitude adjustment means to adjust amplitudes of at least one of said first and said second pickup signals for reducing the difference between the amplitude of said first pickup signal and the amplitude of said second pickup signal when said string is not vibrating, thereby equalizing the amplitudes of the contributions of said external magnetic flux to said first and said second pickup signals, a phase adjustment means to phase shift at least one of said first and said second pickup signals for reducing the variation in the relative phase between said first and said second pickup signals over a range of operating signal-frequencies of said first and said second magnetic pickups, and a combining means to combine the phase-shifted and amplitude-adjusted first and second pickup signals for producing said joint pickup signal therefrom, wherein the contribution of said external magnetic flux to said first pickup signal is subtracted from the contribution of said external magnetic flux from said second pickup signal, thereby reducing the effects of direct magnetic feedback from said driver means.

2. The sustaining device of claim 1 wherein said phase-adjustment means comprises a resistor connected in series with one or both of said first and said second magnetic pickup means.

3. The sustaining device of claim 1 wherein said phase-adjustment means comprises an inductor connected in series with one or both of said first and said second magnetic pickup means.

4. The sustaining device of claim 1 wherein said first pickup signal further comprises response of said first pickup means to said magnetic flux caused by vibration of said string, and said combining means combining said phase-shifted and amplitude-adjusted first and second pickup signals for producing a joint pickup signal comprising a portion of at least one of said response of said first magnetic pickup means to the vibration of said string and said response of said second magnetic pickup means to the vibration of said string.

5. The sustaining device of claim 1 wherein said first and said second magnetic pickups are placed substantially equidistant to said driver.

6. The sustaining device of claim 5 wherein said first magnetic pickup means is placed beneath said second magnetic pickup means.

7. The sustaining device of claim 6 wherein said first magnetic pickup means comprises one or more coils wrapped around a ferromagnetic core and said second magnetic pickup means comprises one or more additional coils wrapped around said ferromagnetic core.

8. The sustaining device of claim 1 wherein said first magnetic pickup means is placed beneath the playing surface of said stringed musical instrument.

9. The sustaining device of claim 1 wherein said first magnetic pickup means comprises one or more coils wrapped around a ferromagnetic core, said second magnetic pickup means comprises one or more additional coils wrapped around said core, said core being curved or otherwise shaped so that endpoles of said core are in close proximity to said string.

10. The sustaining device of claim 1 wherein said magnetic driver means comprises at least one ferromagnetic core and at least one coil wrapped around said core(s), said core(s) being shaped so that endpoles of said core(s) are in close proximity to said string for producing a magnetic dipole in the air between said endpoles that is concentrated at said string, and said coil(s) being wrapped around said core(s) wherein said coil(s) cover all of said core except near said endpoles for confining said magnetic dipole between said endpoles, thereby providing improved interaction between said magnetic flux and said string.

11. The sustaining device of claim 10 wherein said driver means comprises two or more coils wrapped around said core, said sustaining device further comprising a splitting means for splitting said drive signal into two or more split drive signals, each of said coils receiving one of said split drive signals.

12. The sustaining device of claim 11 further comprising a connecting means for providing a drive signal to said string to produce electrical current in said string that interacts with said external magnetic flux for driving vibrations of said string, thereby providing a driving force in two orthogonal planes for driving said string's vibrations.

13. The sustaining device of claim 12 further comprising a grounding means comprising a grounded fretboard, said fretboard comprising electrically conductive frets connected to electrical ground, said string being electrically open except when in contact with one of said frets thereby allowing electrical current to flow in said string, hence allowing said interaction between said electrical current and said magnetic flux to drive said string's vibrations while said string is in contact with one of said frets.

14. The sustaining device of claim 13 wherein said sustaining device is one of a plurality of identical sustaining devices, each of said plurality of identical sustaining devices associated with one string for sustaining vibrations thereof, each of said plurality of sustaining devices further comprising a positioning means for positioning said first and said second pickup means equidistant to each driver means of said plurality of identical sustaining devices for providing said first and said second pickup means with substantially equal magnitudes of total external magnetic flux generated by the sum of each said driver means of said plurality of identical sustaining devices, thereby reducing magnetic interference between said plurality of sustaining devices and an automatic level control means to control the amplitude of said drive signal for controlling the amplitude of vibrations of said string thereby reducing damping of said string's vibrations caused by external magnetic flux generated by each said driver means of said plurality of separate sustaining devices.

15. A sustaining device for prolonging the vibration of a string of a stringed musical instrument, the sustaining device comprising a pickup means responsive to vibration of said string for producing an electrical pickup signal, an amplifier means for amplifying said electrical pickup signal for producing an electrical drive signal, and a magnetic driver means for receiving said electrical drive signal to generate a concentrated external magnetic flux to sustain vibrations of said string, said magnetic driver comprising at least one ferromagnetic core and at least one coil wrapped around said core(s), said core(s) being shaped so that endpoles of said core(s) are in close proximity to said string for producing a magnetic dipole in the air between said endpoles that is concentrated at said string, and said coil(s) being wrapped around said core(s) wherein said coil(s) cover all of said core except said endpoles for confining said magnetic dipole between said endpoles, thereby providing improved interaction between said magnetic flux and said string.

16. The sustaining device of claim 15 further comprising magnetic shielding material wrapped around said core for improving the confinement of said magnetic dipole between said endpoles.

17. A sustaining device for prolonging the vibration of a string of a stringed musical instrument, the sustaining device comprising a magnetic pickup means responsive to external magnetic flux and responsive to vibration of said string for producing a pickup signal, an amplifier means to amplify said pickup signal for producing a drive signal, a splitting means for splitting said drive signal into a first drive signal and a second drive signal, a first magnetic driver means in magnetic proximity to said magnetic pickup means, said first magnetic driver means receiving a phase-shifted amplitude-adjusted first drive signal for generating a first external magnetic flux to drive said string, a second magnetic driver means in magnetic proximity to said magnetic pickup means, said second magnetic driver means receiving said second drive signal or a phase-shifted amplitude-adjusted second drive signal for generating a second external magnetic flux to drive said string, an amplitude adjustment means to adjust amplitudes of at least one of said first and said second drive signals for reducing the difference between the magnitudes of said first and said second external magnetic flux received by said magnetic pickup means, and a phase adjustment means to phase-shift at least one of said first and said second drive signals to compensate for phase variations with respect to frequency between said first and said second drive signals for producing a predetermined phase relationship wherein the variation in relative phase between said first and said second external magnetic flux is reduced over a range of operating signal frequencies of said sustaining device, and the response of said magnetic pickup means to said first magnetic flux subtracts from the response of said magnetic pickup means to said second magnetic flux, thereby reducing the contributions of said first and said second external magnetic flux to said pickup signal.

18. The sustaining device of claim 17 wherein said predetermined phase relationship is substantially 180 degrees.

19. The sustaining device of claim 17 wherein said magnetic pickup means comprises a first magnetic pickup means and a second magnetic pickup means, said first magnetic pickup means being responsive to said first and said second external magnetic flux and responsive to vibration of said string for producing a first pickup signal, and said second magnetic pickup means being responsive to said first and said second external magnetic flux and responsive to vibration of said string for producing a second pickup signal, said sustaining device further comprising summing means for combining said first and said second pickup signals such that said responses of said first and said second magnetic pickup means to a magnetic flux caused by vibration of said string add, and said responses of said first and said second pickup means to said first and said second external magnetic flux cancel.

20. A sustaining device for prolonging the vibration of a string of a stringed musical instrument, the sustaining device comprising a pickup means responsive to vibration of said string for producing a pickup signal, an amplifier means to amplify said pickup signal for producing a drive signal, a magnetic driver means to receive said drive signal to produce an external magnetic flux for driving vibrations of said string in a first plane of oscillation, and a connecting means for providing said drive signal to said string to produce electrical current in said string that interacts with said external magnetic flux for driving vibrations of said string in a second plane of oscillation that is orthogonal to the first plane of oscillation, thereby providing a driving force to said string that is in two orthogonal directions for driving said string's vibrations in their natural elliptical motion.

21. The sustaining device of claim 20 wherein said connecting means comprises an electrically conductive element coupled between the output of said magnetic driver means and said string for providing electrical current to said string.

22. The sustaining device of claim 21, further comprising a grounded fretboard, said grounded fretboard comprising electrically conductive frets connected to electrical ground, said string being electrically open except when in contact with one of said frets for allowing sustained vibrations of said string while said string is in contact with one of said frets.

23. The sustaining device of claim 22 further comprising an isolation means to electrically isolate said string from other strings of said stringed musical instrument.

24. The sustaining device of claim 20 further comprising a cancellation means for canceling responses of said pickup means to said external magnetic flux generated by said magnetic driver means and magnetic flux generated by said electrical current in said string.

25. A sustaining device for prolonging the vibration of a string of a stringed musical instrument, the sustaining device comprising a pickup means responsive to vibration of said string for producing a pickup signal, an amplifier means to amplify said pickup signal for producing a drive signal, a magnetic driver means to receive said drive signal to produce an external magnetic flux for driving vibrations of said string in a first plane of oscillation, and a connecting means for providing DC-level current to said string so that said current interacts with said external magnetic flux for driving vibrations of said string in a second plane of oscillation that is orthogonal to the first plane of oscillation, thereby driving said string's vibrations in an elliptical motion.

26. The sustaining device of claim 25, further comprising a conductive fretboard, said conductive fretboard comprising electrically conductive frets connected to a terminal of a power supply, and an additional connecting means connecting said string to a power input terminal of said amplifier means.

27. The sustaining device of claim 26 further comprising an isolation means to electrically isolate said string from other strings of said stringed musical instrument.

28. The sustaining device of claim 25 further comprising a cancellation means for canceling responses of said pickup means to said external magnetic flux generated by said magnetic driver means.

29. A sustaining device for prolonging the simultaneous vibration of a plurality of strings of a stringed musical instrument, the sustaining device comprising a plurality of separate sustaining devices, each of said plurality of separate sustaining devices associated with one string for sustaining vibrations thereof, each of said sustaining devices comprising a magnetic driver means to generate external magnetic flux for sustaining vibrations of said one string, a first magnetic pickup means responsive to said external magnetic flux generated by said driver means for producing a first pickup signal, a second magnetic pickup means responsive to said external magnetic flux generated by said driver means and responsive to magnetic flux caused by vibration of said string for producing a second pickup signal, an amplifier means to amplify a joint pickup signal resulting from combining said first and said second pickup signals for producing a drive signal, said drive signal being imparted to said driver means for generating said external magnetic flux, a positioning means for positioning said first and said second pickup means equidistant to each driver means of said plurality of separate sustaining devices for providing said first and said second pickup means with substantially equal magnitudes of total external magnetic flux generated by the sum of said drivers, an amplitude adjustment means to adjust the amplitudes of at least one of said first and second pickup signals for reducing the difference between the amplitude of said first pickup signal and the amplitude of said second pickup signal when said one string is not vibrating, thereby equalizing the amplitudes of the contributions of said total external magnetic flux to said first and said second pickup signals, a phase adjustment means to phase shift at least one of said first and said second pickup signals for producing a predetermined phase relationship between said first and said second pickup signals that reduces the frequency-dependent phase variation between said first and second pickup signals over a range of operating signal-frequencies of said first and said second magnetic pickups, a combining means to combine said phase-shifted amplitude-adjusted first and said second pickup signals for producing said joint pickup signal therefrom, wherein the contribution of said total external magnetic flux to said first and said second pickup signals cancels, thereby reducing the effects of magnetic interaction between said plurality of separate sustaining devices, and an automatic level control means to control the amplitude of said drive signal for controlling the amplitude of vibrations of said one string thereby reducing damping of said string's vibrations caused by external magnetic flux generated by drivers of other said plurality of separate sustaining devices.

30. A sustaining device for prolonging the simultaneous vibration of a plurality of strings of a stringed musical instrument, the sustaining device comprising a plurality of magnetic drivers wherein each of said plurality of magnetic drivers receives one of a plurality of drive signals to generate an external magnetic flux for driving vibrations of one of said plurality of strings, a first magnetic pickup means responsive to external magnetic flux generated by said plurality of drivers for producing a first pickup signal, a second magnetic pickup means responsive to said external magnetic flux generated by said plurality of drivers and responsive to magnetic flux caused by vibration of said strings for producing a second pickup signal, an amplitude adjustment means to adjust amplitudes of at least one of said first and said second pickup signals for reducing the difference between the amplitude of said first pickup signal and the amplitude of said second pickup signal when said string is not vibrating, thereby equalizing the amplitudes of the contributions of said external magnetic flux generated by said plurality of drivers to said first and said second pickup signals, a phase adjustment means to phase shift at least one of said first and said second pickup signals for producing a predetermined phase relationship that reduces the frequency-dependent phase variations between said first and said second pickup signals over a range of operating signal-frequencies of said first and said second magnetic pickups, a combining means to combine said phase-shifted amplitude-adjusted first and said second pickup signals for producing said joint pickup signal therefrom, wherein the contribution of said external magnetic flux generated by said plurality of drivers to said first and said second pickup signals cancels, thereby reducing the effects of direct magnetic feedback, a splitting means for splitting said joint pickup signal into a plurality of split pickup signals, an amplifier means comprising a plurality of amplifiers, each of said plurality of amplifiers to amplify each of said plurality of split pickup signals for producing said plurality of drive signals, and an automatic level control means comprising a plurality of level controllers, each of said plurality of level controllers for adjusting the amplitude of each of said plurality of drive signals to some predetermined level, thereby reducing damping of each of said plurality of strings caused by said external magnetic flux generated by said plurality of drivers.

31. A sustaining device as claimed in claim 30 further comprising a filter means to apply a frequency-dependent attenuation to one or more of said plurality of split pickup signals, thereby reducing damping of each of said plurality of strings caused by external magnetic flux.

32. A hand-held sustaining device for prolonging the vibration of a string of a stringed musical instrument, the sustaining device comprising a magnetic driver means to generate external magnetic flux for sustaining vibrations of said string, a pickup means responsive to vibrations of said string for producing a pickup signal, an amplifier means to amplify said pickup signal for producing a drive signal, said drive signal being imparted to said driver for generating said external magnetic flux, a power supply means to provide electrical power to said amplifier means, and an encapsulating means to separate said driver means and said pickup means from said amplifier means and said power supply means, said driver means and said pickup means being combined into a first capsule for providing a compact unit that may be held by a musician near said string, said amplifier means and said power supply means being combined into a second capsule, said second capsule being separated from said first capsule to avoid impeding playing of said instrument by said musician, thereby providing said musician with a non-cumbersome hand-held sustaining device.

33. A sustaining device as claimed in claim 32 wherein said pickup means is a magnetic pickup means, and said sustaining device further comprises a cancellation means for canceling responses of said pickup means to said external magnetic flux, thereby reducing interference in said pickup signal due to the response of said pickup means to said external magnetic flux.

34. A sustaining device as claimed in claim 32 wherein said first capsule further comprises a pick means for plucking said string.

35. A sustaining device as claimed in claim 32 wherein said first capsule further comprises a mounting means for mounting a pick means.

36. A sustaining device as claimed in claim 32 wherein said power supply means comprises a connecting means to a power supply external to said second capsule.

37. A sustaining device as claimed in claim 32 further comprising a signal controlling means for altering said pickup signal or said drive signal, said signal controlling means being contained in one or both said first and said second capsules.

38. A sustaining device as claimed in claim 37 further comprising means for selecting operation of said signal controlling means.

39. A sustaining device as claimed in claim 32 further comprising a capsule mounting means for mounting said second capsule to the body or clothing of said musician.

40. A sustaining device as claimed in claim 32 further comprising a capsule mounting means for mounting said first capsule to the body of said musician.

41. A sustaining device as claimed in claim 32 further comprising a capsule mounting means for mounting said second capsule to said musical instrument.

* * * * *